(12) United States Patent
Satoh et al.

(10) Patent No.: US 7,777,154 B2
(45) Date of Patent: Aug. 17, 2010

(54) METHOD FOR MANUFACTURING DIVIDED WAVEPLATE FILTER

(75) Inventors: Seiji Satoh, Tokyo (JP); Hidehiko Sekizawa, Tokyo (JP)

(73) Assignee: Sony Corporation, Tokyo (JP)

( * ) Notice: Subject to any disclaimer, the term of this patent is extended or adjusted under 35 U.S.C. 154(b) by 497 days.

(21) Appl. No.: 11/232,614

(22) Filed: Sep. 21, 2005

(65) Prior Publication Data
US 2005/0284845 A1 Dec. 29, 2005

Related U.S. Application Data

(62) Division of application No. 10/703,111, filed on Nov. 6, 2003.

(30) Foreign Application Priority Data
Nov. 6, 2002 (JP) ............................. 2002-322642

(51) Int. Cl.
*G02B 27/28* (2006.01)
*G02B 5/30* (2006.01)
*G02B 5/18* (2006.01)

(52) U.S. Cl. .............................. 219/121.85; 156/272.8; 216/94; 427/554

(58) Field of Classification Search ............ 219/121.69; 156/247, 272.8; 359/483; 385/11; 428/11; 216/94; 427/554
See application file for complete search history.

(56) References Cited

U.S. PATENT DOCUMENTS

| | | | |
|---|---|---|---|
| 3,658,616 A | | 4/1972 | Dreyer et al. |
| 4,311,773 A | * | 1/1982 | Kaneko et al. .............. 430/7 |
| 4,515,662 A | * | 5/1985 | Phy ........................... 438/65 |
| 4,621,040 A | * | 11/1986 | Viola ......................... 430/138 |
| 5,051,736 A | * | 9/1991 | Bennett et al. .............. 345/180 |
| 5,215,757 A | | 6/1993 | El-Nokaly |
| 5,245,438 A | * | 9/1993 | Yamamoto et al. .......... 358/296 |
| 5,306,373 A | * | 4/1994 | Swan .......................... 156/242 |
| 5,601,884 A | | 2/1997 | Ohnishi et al. |
| 5,657,105 A | * | 8/1997 | McCartney .................. 349/157 |
| 5,721,087 A | * | 2/1998 | Yokoya et al. .............. 430/200 |
| 5,746,701 A | * | 5/1998 | Noone ......................... 600/585 |
| 5,786,117 A | * | 7/1998 | Hoshi et al. .................. 430/21 |
| 5,849,857 A | | 12/1998 | Awaji et al. |

(Continued)

FOREIGN PATENT DOCUMENTS

JP         356160893 A   *  12/1981

(Continued)

*Primary Examiner*—Samuel M Heinrich
(74) *Attorney, Agent, or Firm*—Wolf, Greenfield & Sacks, P.C.

(57) ABSTRACT

A method to manufacture a divided waveplate filter by laser irradiation. A material layer is formed on the surface of a substrate material. A laser oscillator programmed to form a predetermined pattern scans light to form the divided waveplates. In some embodiments, the divided waveplate material layer may be selectively removed by laser ablation. In some embodiments, the material layer has a phase-difference characteristic and the divided waveplates may be formed by removing the phase-difference characteristic of the material layer using laser light without removing the material layer itself. The material layer may be covered by a laser absorbing layer such as titanium oxide. The divided waveplate may be protected by covering the entire surface with a protective layer 6.

14 Claims, 18 Drawing Sheets

U.S. PATENT DOCUMENTS

| | | | |
|---|---|---|---|
| 5,953,091 A | 9/1999 | Jones et al. | |
| 6,001,277 A | 12/1999 | Ichimura et al. | |
| 6,064,524 A | 5/2000 | Oka et al. | |
| 6,090,508 A * | 7/2000 | Tsutsui et al. | 430/20 |
| 6,097,871 A * | 8/2000 | De Dobbelaere et al. | 385/129 |
| 6,118,096 A * | 9/2000 | Feng et al. | 219/121.69 |
| 6,184,959 B1 * | 2/2001 | Izumi | 349/124 |
| 6,198,069 B1 * | 3/2001 | Hackel et al. | 219/121.6 |
| 6,208,783 B1 * | 3/2001 | Wach | 385/43 |
| 6,225,206 B1 * | 5/2001 | Jimarez et al. | 438/616 |
| 6,306,010 B1 * | 10/2001 | West et al. | 451/36 |
| 6,437,915 B2 | 8/2002 | Moseley et al. | |
| 6,498,679 B2 * | 12/2002 | Lee et al. | 359/483 |
| 6,555,294 B1 * | 4/2003 | Albertini et al. | 430/311 |
| 6,650,387 B1 | 11/2003 | Asao et al. | |
| 6,734,923 B2 * | 5/2004 | Kwon et al. | 349/15 |
| 6,738,335 B1 * | 5/2004 | Todori et al. | 369/94 |
| 6,785,447 B2 * | 8/2004 | Yoshimura et al. | 385/42 |
| 6,958,093 B2 * | 10/2005 | Vaudo et al. | 117/90 |
| 6,961,490 B2 * | 11/2005 | Maisenhoelder et al. | 385/37 |
| 7,006,165 B1 * | 2/2006 | Miller et al. | 349/24 |
| 7,008,989 B2 * | 3/2006 | Sarkis et al. | 524/430 |
| 7,227,684 B2 * | 6/2007 | Wang et al. | 359/486 |
| 7,342,623 B2 * | 3/2008 | Ishizaki | 349/114 |
| 7,570,424 B2 * | 8/2009 | Perkins et al. | 359/486 |
| 7,630,133 B2 * | 12/2009 | Perkins | 359/486 |
| 2002/0008837 A1 | 1/2002 | Hisamitsu et al. | |
| 2002/0015187 A1 * | 2/2002 | Motonaga et al. | 358/298 |
| 2002/0054965 A1 | 5/2002 | Ogawa | |
| 2002/0131665 A1 * | 9/2002 | Sriram et al. | 385/2 |
| 2002/0152611 A1 * | 10/2002 | Tung et al. | 29/846 |
| 2005/0042391 A1 | 2/2005 | Ryan et al. | |

FOREIGN PATENT DOCUMENTS

| | | | |
|---|---|---|---|
| JP | 58200542 A * | 11/1983 | |
| JP | 03293194 A * | 12/1990 | |
| JP | 04294190 A * | 3/1991 | |
| JP | 07152141 A * | 6/1995 | |
| JP | 409061989 A * | 3/1997 | |
| JP | 09-090278 | 4/1997 | |
| JP | 09090278 A * | 4/1997 | |
| JP | 409277705 A * | 10/1997 | |
| JP | 10-160933 | 6/1998 | |
| JP | 10-227998 | 8/1998 | |
| JP | 02000039512 A * | 2/2000 | |
| JP | 2000-289000 | 10/2000 | |
| JP | 2001-059949 | 3/2001 | |
| JP | 2001-075048 | 3/2001 | |
| JP | 2001-100150 | 4/2001 | |
| JP | 2001-147499 | 5/2001 | |
| JP | 2001-059948 | 6/2001 | |
| JP | 2002-014301 | 1/2002 | |
| JP | 02002002161 A * | 1/2002 | |

\* cited by examiner (a)

(b)

METHOD FOR MANUFACTURING DIVIDED WAVEPLATE FILTER

CROSS REFERENCE TO RELATED APPLICATIONS

This application is a division of application Ser. No. 10/703,111, filed Nov. 6, 2003, entitled METHOD FOR MANUFACTURING DIVIDED WAVEPLATE FILTER, which in turn, claims priority to Japanese Application No. 2002-322642, filed Nov. 6, 2002, which prior applications are incorporated herein by reference.

BACKGROUND OF THE INVENTION

1. Field of the Invention

The present invention relates to a method for manufacturing a divided waveplate filter for, for example, a stereoscopic image display unit.

2. Description of the Related Art

Various technologies for representing images three-dimensionally were tried in the past. Many display methods for three-dimensional images have been studied and put to practical use in many fields, such as, photography, movies, and television. The display methods of three-dimensional images are roughly separated into methods with and without eyeglasses. In both methods, images having binocular parallax are input into the right eye and the left eye of a viewer, and the viewer can see the images as a stereoscopic image.

Typical methods with eyeglasses include a so-called anaglyph method using red-blue glasses and a method using polarization eyeglasses. Unfortunately, color separation methods such as the anaglyph method have qualitative disadvantages, for example, difficulty in color expression and a deterioration of a visual field. The method using polarization eyeglasses generally requires two projectors; a method for stereoscopic display using a direct-view display unit is proposed in recent years.

FIG. 19 is a schematic view of a stereoscopic image display unit using polarization eyeglasses.

A stereoscopic image display unit 200 includes a liquid crystal panel unit 201 and a divided waveplate filter part 202 attached to the liquid crystal panel unit 201. In the liquid crystal panel unit 201, a pair of transparent support substrates 204 and 206 is disposed between a pair of polarizer 203 and 207. A pixellated liquid crystal part 205 including RGB pixels is disposed between the transparent support substrates. The divided waveplate filter part 202 is disposed on the surface of the liquid crystal panel unit 201. In the divided waveplate filter part 202, for example, divided waveplates 208 are disposed with gaps therebetween on a single side of the transparent support substrate 209. The divided waveplate filter part 202 is also called a micro-pol (µ-pol) or a micropolarizer.

In the stereoscopic image display unit 200 having such a structure, linear polarizations from even-numbered lines and odd-numbered lines of the display screen are converted to be orthogonal by rotating the linear polarizations emitted from the liquid crystal panel unit 201. Accordingly, one linear polarization from the liquid crystal panel unit 201 is emitted as is from the even-numbered lines, and one linear polarization from the liquid crystal panel is emitted from the odd-numbered lines to be orthogonal because of the function of the divided waveplates 208.

The respective eyes of the eyeglasses 210 let in orthogonal light from the display unit in the polarization direction thereof. When a viewer observes with the eyeglasses 210, light of the image for the right eye is incident on the right eye and light of the image for the left eye is incident on the left eye. Accordingly, the viewer can see a full-color stereoscopic image without flicker.

As described above, the stereoscopic image display unit 200 includes the liquid crystal panel unit 201 and divided waveplate filter part 202, thereby enabling the display of stereoscopic images. The viewer can see the stereoscopic images by wearing the polarization eyeglasses 210. In the liquid crystal panel unit 201, the pixellated liquid crystal part 205 is disposed between the pair of transparent support substrates 204 and 206, and is composed of a combination of red pixels (R), green pixels (G), and blue pixels (B). In the pixellated liquid crystal part 205, pixel portions composed of the three colors are arranged in a matrix.

The light passing through the polarizer 207 disposed at the viewer-side of the transparent support substrate 206 becomes linearly polarized. The linearly polarized light is then incident on the divided waveplate filter part 202. The divided waveplate filter part 202 includes a transparent support substrate 209 composed of, for example, glass, which functions as a frame. The strip-shaped divided waveplates 208 are disposed at the liquid crystal panel unit 201 side of the transparent support substrate 209. The divided waveplates 208 extend such that the longitudinal direction is the horizontal direction. The width of each strip is about the same as the pixel pitch of the pixellated liquid crystal part 205. The number of the divided waveplates 208 is half of the number of pixels in vertical direction of the pixellated liquid crystal part 205.

The strip-shaped divided waveplates 208 are disposed with gaps therebetween at the pixel pitch of the pixellated liquid crystal part 205. Accordingly, either a stereoscopic image for the right eye or a stereoscopic image for the left eye passes through the divided waveplates 208, thereby rotating the polarization direction by 90°. The other stereoscopic image, which does not pass through the divided waveplates 208, is emitted without rotating its polarization direction.

As described above, the polarization on the stereoscopic image is controlled in each line to have different polarization directions. After passing through the divided waveplates 208, two orthogonal linear polarizations are mixed. Accordingly, a viewer wearing the polarization eyeglasses 210 can see the stereoscopic image with both eyes by selectively receiving the stereoscopic image for the right eye and the stereoscopic image for the left eye.

In the stereoscopic image display unit 200 as described above, in order to satisfactorily appreciate the stereoscopic image without cross talk, the strip-shaped divided waveplates 208 are formed so as to accurately correspond to the pixel pitch. That is, the strip-shaped divided waveplates 208 are accurately arrayed to the stripe lines of the pixellated liquid crystal part 205.

Accordingly, there have been increasing demands for manufacturing the divided waveplates 208 with high precision. The following needs should be satisfied: The divided waveplates 208 having fine widths (100 µm to 200 µm) should be precisely manufactured. The divided waveplates 208 having a precise shape and uniform thickness should be disposed with gaps therebetween. The shape and width of the divided waveplates 208 should be uniform over the plane. Furthermore, the divided waveplates 208 having such precise and uniform shapes must be manufactured stably and with good reproducibility.

FIG. 20 is a schematic perspective view showing an example of a conventional manufacturing method of the divided waveplates 208. A grinder 20 is used for conventionally manufacturing the divided waveplates 208. The grinder 20 has a grinding stone having a small width. The grinder 20 is used for forming stripe shapes of a phase difference material layer 3, for example a phase difference film, disposed on the transparent support substrate (hereinafter referred to as glass substrate) 209. Specifically, the phase difference material layer 3 is scraped away every other line with the grinder 20, thereby forming removed portions 4 and divided waveplates 208.

Unfortunately, since the phase difference material layer 3 is composed of a resin, the grinding stone of the grinder 20 becomes clogged with the resin. Accordingly fine processing is difficult to achieve. Furthermore, resin softened by frictional heat limits the revolving speed of the grinder 20. In addition, grinders cannot be arranged in a row. Accordingly, mass production of the divided waveplates is difficult by the conventional method and a rapid solution to these problems is required.

SUMMARY OF THE INVENTION

Accordingly, it is an object of the present invention to provide a method for manufacturing a divided waveplate filter which allows high patterning precision, uniform thickness, and uniformity over a plane to be achieved, so that divided waveplates are disposed accurately corresponding to pixel portions, and the method having a high reproducibility and high mass-production efficiency.

The present invention provides a method for manufacturing a divided waveplate filter including divided waveplates for controlling a polarization direction of light emitted from each pixel region divided corresponding to parallax in a pixellated display unit, the method includes the steps of forming a material layer for the divided waveplates; and forming a predetermined division pattern on the material layer by a print process (hereinafter referred to as a first manufacturing method).

According to the first manufacturing method of the present invention, print processes are applied to form the predetermined division pattern of the material layer for a divided waveplates. Accordingly, the material layer for a divided waveplates and a material layer, such as an underlayer, required for forming the divided waveplates have a uniform pattern and uniform thickness because of the printing processes. According to the first manufacturing method, divided waveplates having the predetermined pattern can be precisely manufactured in large quantities, thereby attaining the above object at any time.

According to the first manufacturing method of the present invention, preferably, the adhesive layer is printed on a substrate to form the division pattern by the print process, and a material layer is formed on the substrate, and then the material layer in regions where the adhesive is not applied is selectively removed.

The material layer preferably has a phase-difference characteristic.

The material layer may be a birefringent liquid crystal polymer layer, and the birefringent liquid crystal polymer layer may be aligned so as to have the division pattern.

In this case, preferably, an alignment film is formed on the entire surface or areas defined by the predetermined pattern on the substrate, and the alignment film is formed by rubbing an alignment film material layer formed on the substrate. According to this method, preferably, an alignment film material layer is formed, and then the alignment film material layer is rubbed to form the alignment film. This method is preferable in that a phase-difference characteristic is easily given to the polymer layer along the direction of orientation of the alignment film.

Furthermore, the alignment film material layer may be formed by printing, and the birefringent liquid crystal polymer layer is formed on the entire surface or the areas defined by the division pattern on the alignment film material layer by printing. This method is preferable in that the alignment film and the polymer layer are formed such that they have uniform thickness.

In this case, the birefringent liquid crystal polymer layer may be printed such that the birefringent liquid crystal polymer layer has the division pattern, and the birefringent liquid crystal polymer layer may be aligned. Then the birefringent liquid crystal polymer layer may be heated. This method is preferable in that the orientation is strengthened and stabilized.

The material layer may be a photo-curable monomer layer.

In this case, preferably, the alignment film is formed on the entire surface or areas defined by the division pattern on the substrate, the photo-curable monomer layer is formed on the entire surface or the areas defined by the division pattern on the alignment film, the photo-curable monomer layer is polymerized by exposure, and the polymerized layer is aligned. Furthermore, the alignment film is preferably formed by rubbing an alignment film material layer formed on the substrate. Accordingly, this method is preferable in that a phase-difference characteristic is easily given to the polymer layer along the direction of orientation of the alignment film.

Furthermore, the alignment film material layer may be formed by printing, and then the photo-curable monomer layer may be formed on the entire surface or the areas defined by the division pattern on the alignment film material layer by printing. This method is preferable in that the alignment film and the monomer layer are formed such that they have uniform thickness.

The photo-curable monomer layer may be exposed by polarized light to form the division pattern.

The photo-curable monomer layer may be formed on the entire surface or areas defined by the division pattern by printing, and the photo-curable monomer layer may be polymerized by exposure, and the polymerized layer may be aligned by rubbing.

The material layer may be formed on the entire surface or areas defined by the division pattern, heat absorbing ink may be printed on the areas defined by the division pattern, and entire surface of the resultant substrate having the material layer and the heat absorbing ink may be exposed.

The present invention provides a method for manufacturing a divided waveplate filter including divided waveplates for controlling a polarization direction of light emitted from each pixel region divided corresponding to parallax in a pixellated display unit, the method includes the steps of forming a highly adhesive layer having highly adhesive properties on a first substrate such that the highly adhesive layer has a predetermined division pattern; forming a material layer for the divided waveplates on a second substrate; pressing together into contact the first substrate and the second substrate by contacting the highly adhesive layer and the material layer; and transcribing the same division pattern of the material layer onto the highly adhesive layer on the first substrate by separating these substrates (hereinafter referred to as a second manufacturing method).

According to the second manufacturing method of the present invention, the highly adhesive layer having highly adhesive properties is formed on the first substrate and the material layer for the divided waveplates is formed on the second substrate. The first substrate and the second substrate are pressed together into contact and then the both substrates are separated, thereby transcribing the same pattern of the material layer on the second substrate onto the highly adhesive layer on the first substrate. According to the manufacturing method, the highly adhesive layer is formed on the first substrate such that the highly adhesive layer has the predetermined pattern according to the design and then the material layer for the divided waveplates can be transcribed from the second substrate to the highly adhesive layer on the first substrate. Accordingly, the divided waveplates having the predetermined pattern can be precisely formed on the first substrate with simple processes. The second manufacturing method of a divided waveplate filter is suitable for mass-production.

According to the second manufacturing method of the present invention, the highly adhesive layer is preferably formed on the first substrate by printing.

The material layer remaining on the second substrate, which has the reverse pattern of the highly adhesive layer, is preferably also used for the divided waveplates.

The present invention provides a method for manufacturing a divided waveplate filter including divided waveplates for controlling a polarization direction of light emitted from each pixel region divided corresponding to parallax in a pixellated display unit, the method includes the steps of forming a material layer for the divided waveplates; and irradiating the material layer with laser light such that the material layer has a predetermined division pattern (hereinafter referred to as a third manufacturing method).

According to the third manufacturing method of the present invention, the material layer for the divided waveplates is formed and is irradiated with laser light to form the predetermined pattern. In this method, an irradiation pattern is formed corresponding to the areas of divided waveplates to be left. According to the third manufacturing method, divided waveplates having the predetermined pattern can be precisely manufactured in large quantities.

According to the third manufacturing method, the material layer may be selectively ablated by laser irradiation to leave the material layer having the division pattern.

In this case, the material layer may have a phase-difference characteristic, a laser-absorbing material layer may be formed on the material layer, and the phase-difference characteristic of the material layer may be selectively removed by the laser irradiation to leave only the material layer having the division pattern with the phase-difference characteristic.

The present invention provides a method for manufacturing a divided waveplate filter including divided waveplates for controlling a polarization direction of light emitted from each pixel region divided corresponding to parallax in a pixellated display unit, the method includes the steps of forming an adhesive layer on a substrate;

forming a material layer for the divided waveplates thereon; and selectively cutting and removing the material layer to leave a predetermined division pattern in the material layer (hereinafter referred to as a fourth manufacturing method).

According to the fourth manufacturing method, the adhesive layer is formed on the substrate and material layer for the divided waveplates is formed thereon. Then the material layer is selectively removed to form the division pattern. The area having the division pattern and the area to be removed can be divided by cutting the material layer. Accordingly, the area having the division pattern can be precisely manufactured in large quantities on the adhesive layer by removing the unwanted area.

According to the fourth manufacturing method, the material layer preferably has a phase-difference characteristic. Furthermore the cutting and removing of the material layer is preferably performed with cutter blades arranged in a row, thereby enhancing the mass-production efficiency.

In this case, preferably, the adhesive layer is formed on the entire surface or areas defined by the division pattern, and the material layer is preferably formed thereon.

The cutting and removing process may be performed by high-pressure liquid jetting. In this case, the liquid is preferably water and the temperature of the water is not limited.

According to all of the above manufacturing processes, the resultant divided waveplates are preferably covered with a protective layer.

DESCRIPTION OF THE PREFERRED EMBODIMENTS

The preferred embodiments according to the present invention will now be described with reference to the drawings.

According to the embodiments of the present invention, for example, a divided waveplate material layer, which is a material layer for the divided waveplates, an alignment film material, and an adhesive layer are formed mainly by printing or by bonding, in the formation process of each layer. The process includes three different methods. In a method, the adhesive layer is formed on a substrate such that the layer has a predetermined division pattern, a film having phase-difference characteristic is attached, and the film is cut and removed such that the film also has the predetermined division pattern. In another method, the alignment film material layer is formed on the entire surface or areas defined by the division pattern, the alignment film material layer is subjected to orientation treatment, the divided waveplate material layer is formed on the entire surface or areas defined by the division pattern, and the resultant substrate is exposed to form the divided waveplate. In another method, the divided waveplate material layer is disposed on a substrate and is directly subjected to orientation treatment to form the divided waveplate.

First Embodiment

Figure 1:
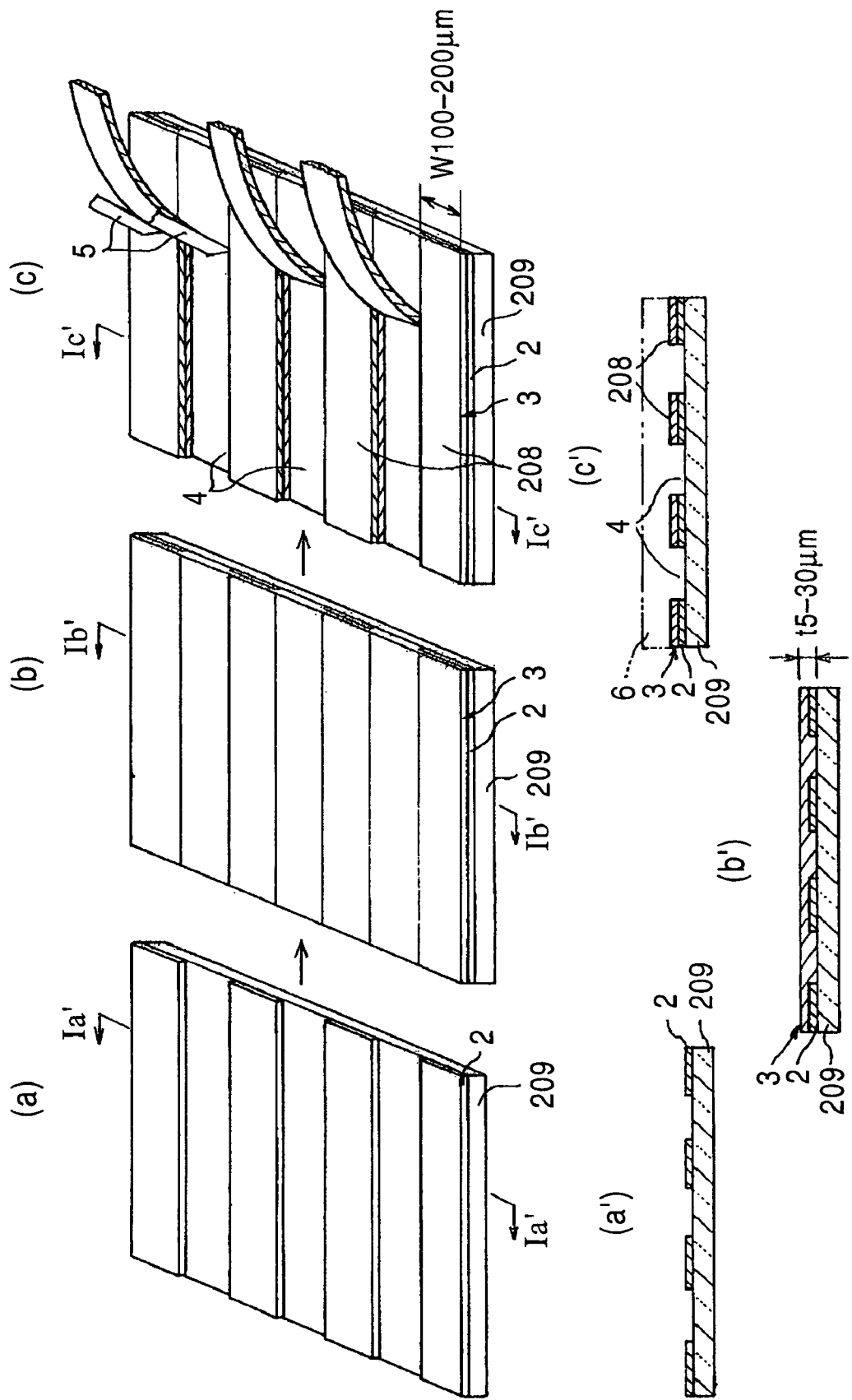
FIG. 1 illustrates a forming process of a divided waveplate filter according to a first embodiment of the present invention.
Figure 19:
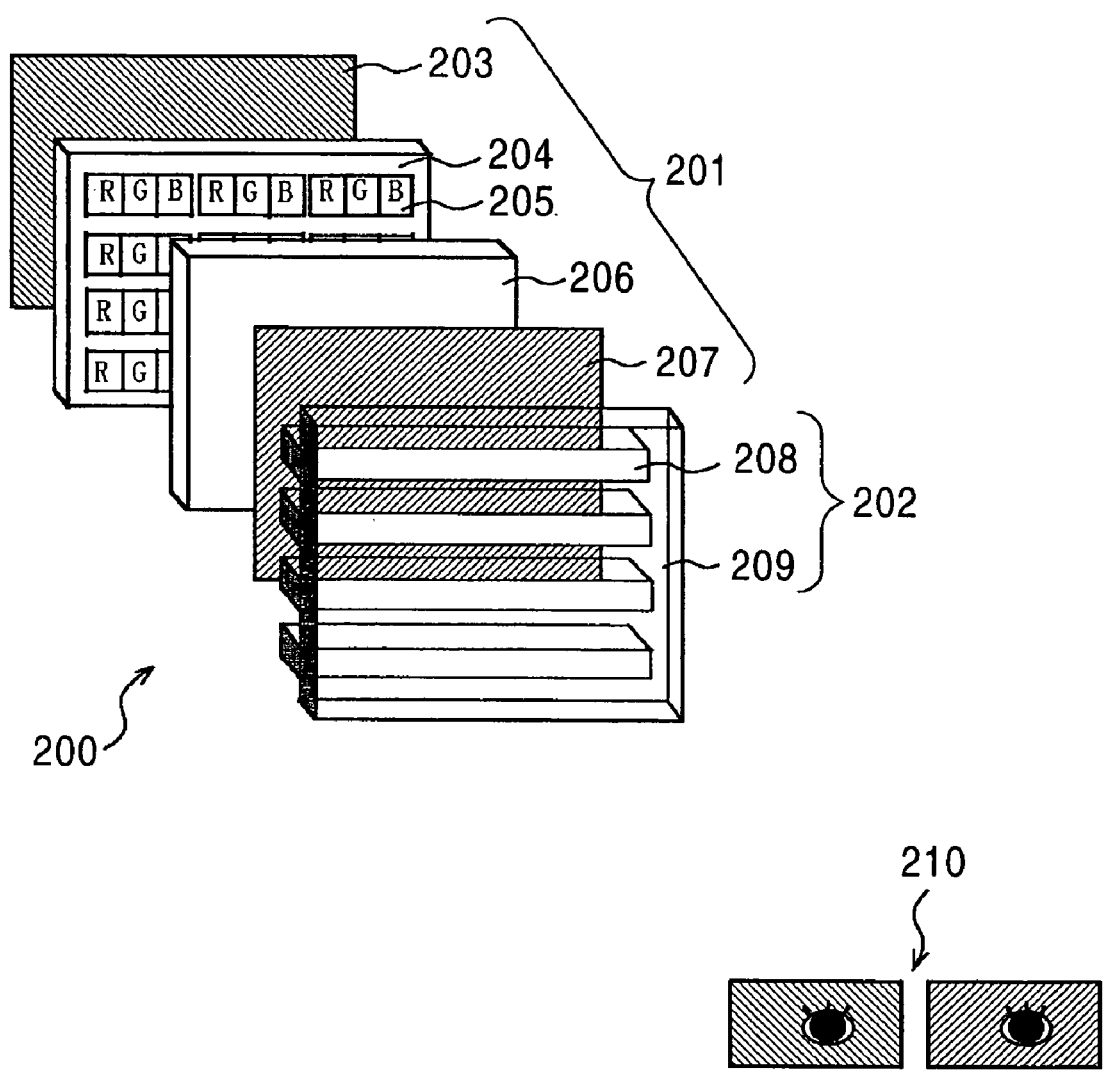
FIG. 19 is an exploded schematic view showing a composition of a stereoscopic image display unit including a liquid crystal panel unit and a divided waveplate filter part.
Figure 20:
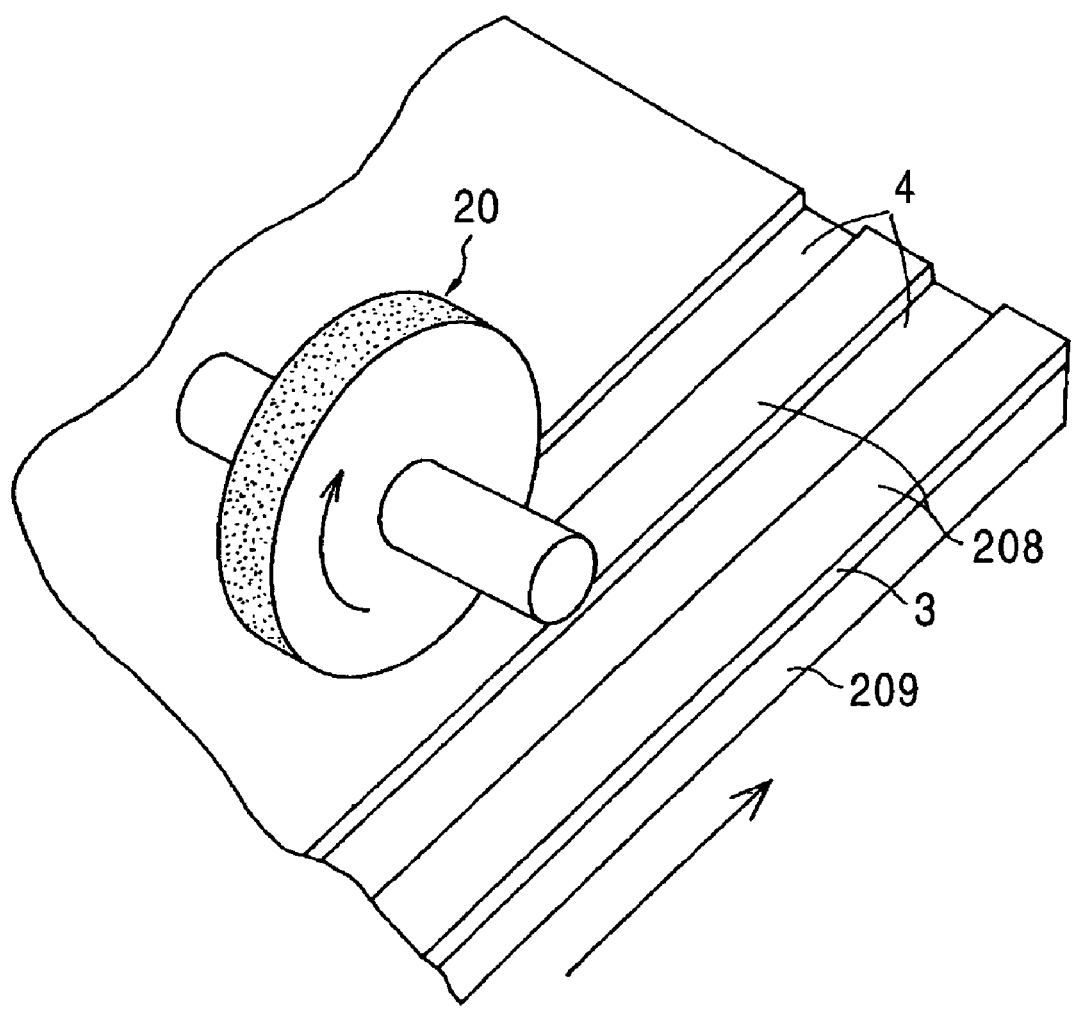
FIG. 20 is a perspective view showing a manufacturing method of a divided waveplate filter according to the conventional art.

FIG. 1 illustrates a forming process of the divided waveplates according to the present embodiment for dividing a divided waveplate material layer into a predetermined division pattern. The process includes the steps of printing an adhesive on a substrate; disposing a divided waveplate material layer; and cutting the divided waveplate material layer to form the division pattern. Part (a) in FIG. 1 shows the substrate with the adhesive formed thereon; part (b) in FIG. 1 shows the substrate further having a divided waveplate material layer attached thereon; and part (c) in FIG. 1 shows the substrate wherein the divided waveplate material layer is cut. Common reference numerals are used for the common portions in the conventional art shown in FIG. 19 (as well in other embodiments).

Referring to part (a) in FIG. 1, an adhesive 2 is disposed on a glass substrate 209 (hereinafter referred to as substrate 209) by printing so that the adhesive 2 has a predetermined division pattern. The printing allows a uniform thickness of the adhesive 2 to be formed. Referring to part (b) FIG. 1, a divided waveplate material layer 3 is disposed on the entire surface. Although a film having a phase-difference characteristic is attached as the divided waveplate material layer 3 in FIG. 1, another material to be described later may be disposed on the entire surface, and then the material may be subjected to orientation treatment such that the material layer has the division pattern.

Referring to part (c) in FIG. 1, the divided waveplate material layer 3 is cut all at once with cutter blades 5 (for example knives) along the pattern of the adhesive 2 disposed on the substrate 209 in advance. Although the cuter blades 5 are arranged in a row so as to cut all at once, the structure shown in part (c) of FIG. 1 is simplified. The cutting divides the surface of the substrate 209 into areas where the adhesive 2 is applied and areas where it is not applied. Each part of the divided waveplate material layer 3 removed from the area where the adhesive 2 is not applied is taken up by take-up equipment (not shown in the figure). Accordingly, the divided waveplates 208 disposed with gaps therebetween can be formed with high precision such that the divided waveplates 208 are disposed along the alternate pixel lines of the pixellated liquid crystal part 205 shown in FIG. 19.

Part (a') in FIG. 1 is a sectional view taken along line Ia'-Ia' of part (a) in FIG. 1, part (b') in FIG. 1 is a sectional view taken along line Ib'-Ib' of part (b) in FIG. 1, and part (c') in FIG. 1 is a sectional view taken along line Ic'-Ic' of part (c) FIG. 1. Referring to part (b') in FIG. 1, the divided waveplate material layer 3 has a thickness t of 5 μm to 30 μm. Referring to part (c) in FIG. 1, the divided waveplates are formed such that the width w of each divided waveplate is 100 μm to 200 μm. Referring to part (c') in FIG. 1, after the cutting, the surface of the substrate 209 is covered with a protective layer 6 (indicated by the imaginary line).

Figure 2:
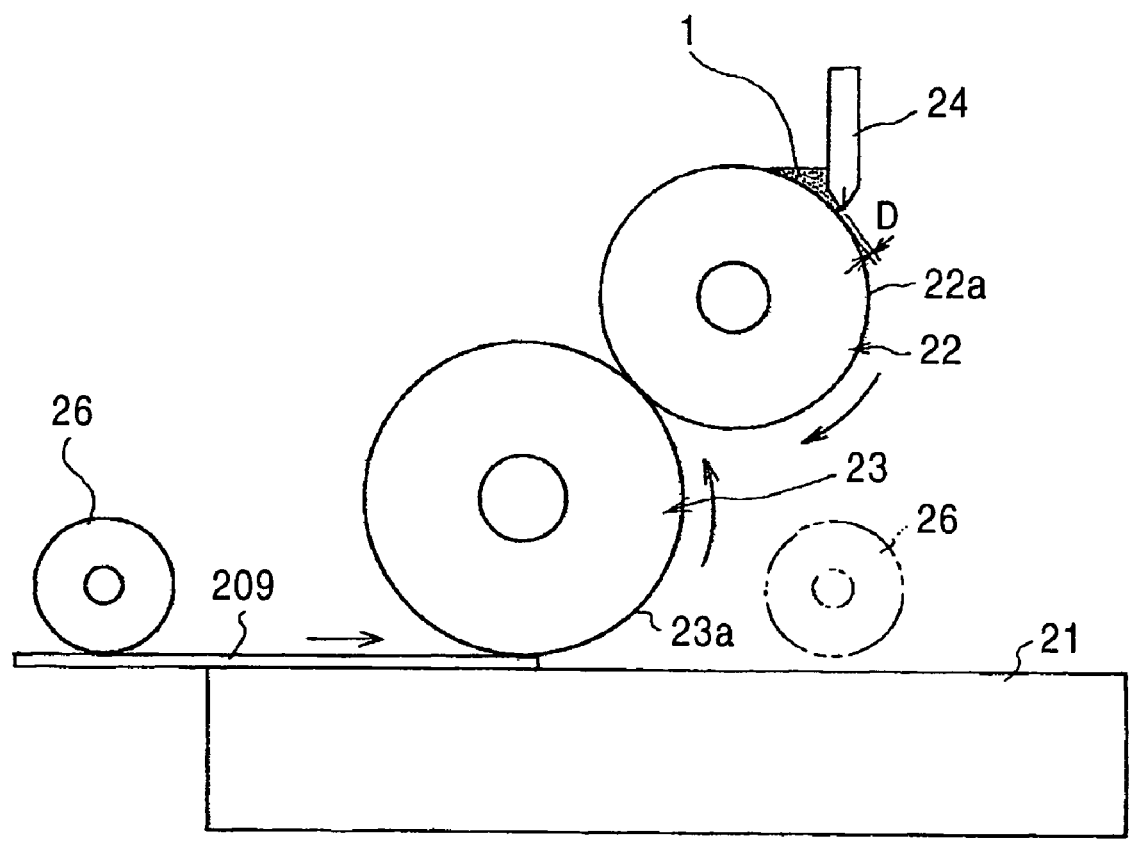
FIG. 2 is a schematic view of a printing device according to the first embodiment of the present invention.

A device, for example, shown in FIG. 2 is used for printing. FIG. 2 is a schematic view of the printing device. Referring to FIG. 2, a printing roll 23 and an anilox roll 22, which rotates while contacting therewith, are fixed in position above a table 21. These rolls rotate in the directions indicated by the arrows. A doctor blade 24 is disposed at the upper, offset part of the anilox roll 22 such that a fixed distance D is formed between a roll face 22a of the anilox roll 22 and the doctor blade 24. At the upstream side of the doctor blade 24, a printing material 1, which is a material for the divided waveplates, is fed between the anilox roll 22 and the doctor blade 24. Thus, the printing material 1 is applied with a fixed thickness depending on the distance D.

A predetermined pattern for forming the divided waveplate is formed as a master plate having protruding portions according to a design on a roll face 23a of the printing roll 23. The printing material 1 is fed on the roll face 22a of the anilox roll 22. As described above, the doctor blade 24 controls the thickness of the printing material 1 such that the thickness is uniform. The printing material 1 is adhered to the roll face 22a and is transported to the downstream side in the rotating direction.

Accordingly, the printing material 1, which is adhered to the roll face 22a of the anilox roll 22, is adhered to the protruding portions of the master plate formed on the roll face 23a of the printing roll 23. Then the printing material 1 is transcribed onto the surface of the substrate 209 carried between the printing roll 23 and table 21 in the direction indicated by the arrow, thereby transcribing the predetermined pattern. The printing material 1 for transcribing is the adhesive 2 described above, and an alignment film material and divided waveplate material described later.

Referring to FIG. 2, rubbing rolls 26 are used for orientation treatment of the alignment film material or the divided waveplate material disposed on the substrate 209. One of the rubbing rolls 26 is disposed at the upstream side of the printing roll 23 (indicated by solid line) and the other rubbing roll 26 is disposed at the downstream side of the printing roll 23 (indicated by imaginary line).

According to the first embodiment, the master plate having the predetermined pattern is formed according to the design on the roll face 23a of the printing roll 23, and the printing material 1, which is the adhesive 2, (or the alignment film material and the divided waveplate material described later) is formed on the substrate 209 by printing, such that the printing material 1 has the predetermined pattern. Therefore, a uniform pattern and a uniform thickness of the printing material 1 can be formed. The divided waveplate material layer 3 adhered to the adhesive 2 is cut all at once with the cutter blades 5 arranged in a row along the predetermined pattern, thereby enabling precise formation and mass production of a divided waveplate filter. Accordingly, the present embodiment provides a method for manufacturing a divided waveplate filter of a stereoscopic image display unit which meets the precision demands, namely, that the divided waveplates be formed with gaps therebetween so as to accurately correspond to the alternate lines of pixel, and the mass-production demands.

Second Embodiment

Figure 3:
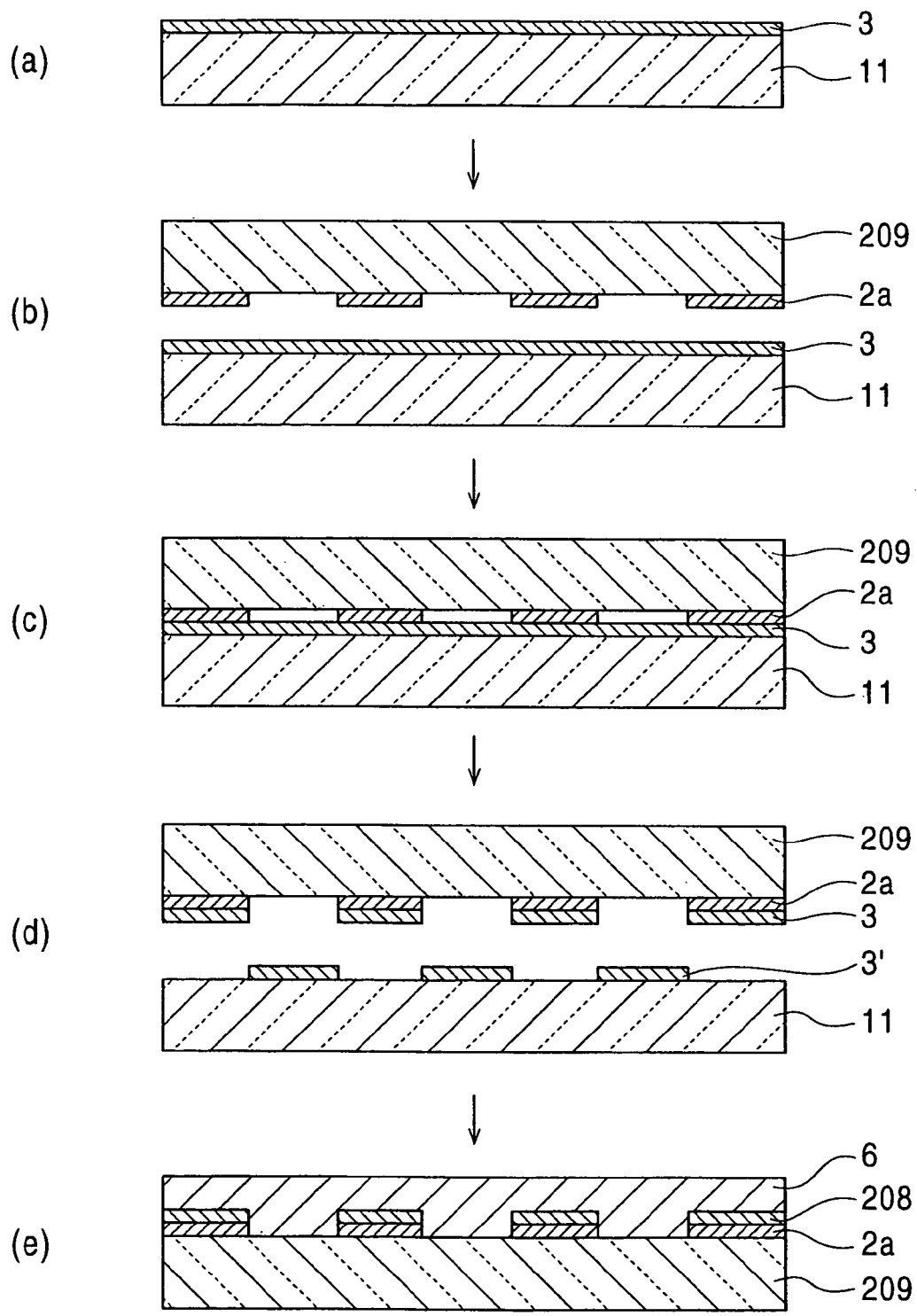
FIG. 3 illustrates a manufacturing process of a divided waveplate filter according to a second embodiment of the present invention.

FIG. 3 illustrates a forming process of the divided waveplates according to a second embodiment. According to the second embodiment, a divided waveplate material layer 3 is formed by printing on a substrate 11, which is a second substrate; an adhesive layer 2a is formed on a substrate 209, which is a first substrate, such that the adhesive layer 2a has a predetermined pattern; and the divided waveplate material layer 3 is transcribed onto the substrate 209 by means of the adhesive layer 2a.

Referring to part (a) in FIG. 3, the divided waveplate material layer 3 having a uniform thickness is formed on the entire surface of the substrate 11 by the printing process shown, for example, in FIG. 2.

Referring to part (b) in FIG. 3, the adhesive layer 2a, which is a highly adhesive layer having highly adhesive properties, is formed on the substrate 209 by the printing process shown, for example, in FIG. 2 such that the adhesive 2a layer has a predetermined designed pattern. The substrate 209 is disposed over the substrate 11. Referring to part (c) in FIG. 3, both substrates 11 and 209 are pressed into contact.

Referring to part (d) in FIG. 3, the substrates 11 and 209 are separated. The substrate 11 may be moved downward or the substrate 209 may be moved upward. The separation allows the divided waveplate material layer 3 disposed at positions corresponding to the adhesive layer 2a on the substrate 209 to be transcribed from the substrate 11 to substrate 209 such that the divided waveplate material layer 3 has the predetermined pattern. Accordingly, the divided waveplates 208 disposed with gaps therebetween are precisely formed such that the divided waveplates 208 are disposed corresponding to the lines of pixel shown in FIG. 19.

Referring to part (e) in FIG. 3, the substrate 209 is turned over, and the surface of the divided waveplate material layer 3 is subjected to orientation treatment by the rubbing rolls 26 shown, for example, in FIG. 2, thereby forming the divided waveplates 208. Then the entire surface of the substrate 209 is covered with a protective layer 6.

Referring to part (d) in FIG. 3, a divided waveplate material layer 3', which is not transcribe but remains, is disposed on the substrate 11. The divided waveplate material layer 3' also has a predetermined pattern. Although not shown in FIG. 3, unwanted portions at both ends of the substrate 11, for example, may be cut and removed. In that case, the substrate 11 has the divided waveplate material layer 3' having the same pattern as formed on the substrate 209. After orientation treatment as on the substrate 209, the substrate 11 can also be used as a divided waveplate filter.

According to the second embodiment, the divided waveplate material layer 3 disposed on the entire surface of the substrate 11 and having a uniform thickness is transcribed onto the substrate 209 by means of the adhesive layer 2a having highly adhesive properties and having a uniform thickness and a predetermined pattern. Accordingly, precise formation and mass production of the divided waveplate filter are possible. The present embodiment provides a method for manufacturing a divided waveplate filter of a stereoscopic image display unit which meets the precision demands, namely, that the divided waveplates be formed with gaps therebetween so as to accurately correspond to the lines of pixel, and the mass-production demands.

Furthermore, the divided waveplate material layer 3' having precisely the same predetermined pattern remains on the substrate 11, which is disposed opposite the substrate 209. The predetermined designed pattern can be simultaneously formed on two substrates by the transcribing process to form the divided waveplates 208. Since the divided waveplate filter can be precisely manufactured by a simple process, a method for more efficient mass production is provided.

FIGS. 4 to 13 show concrete examples of the divided waveplate material layer, the alignment film material layer, and orientation treatments of these material layers according to the embodiments described above.

Figure 4:
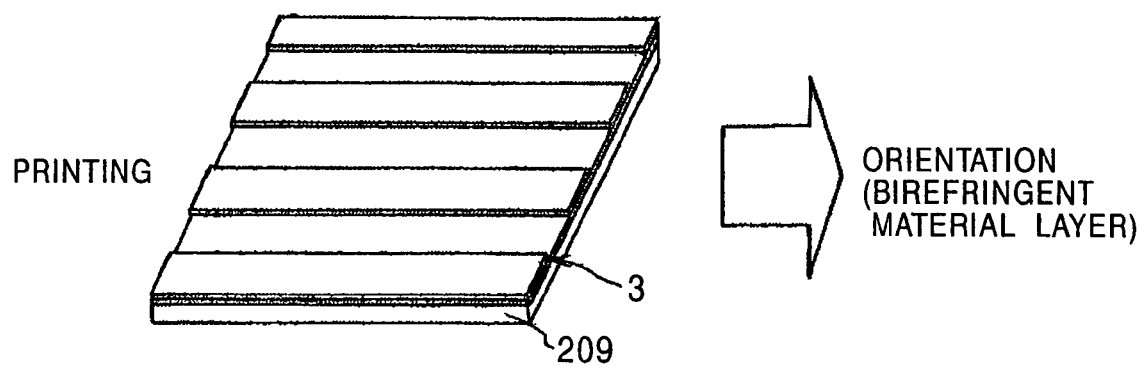
FIG. 4 illustrates a conception of an orientation treatment after printing a material layer according to each embodiment of the present invention.

FIG. 4 shows a conception of an orientation treatment after printing a material layer according to each embodiment of the present invention. The above divided waveplate material layer 3 and, for example, the alignment film material layer described later are formed on the substrate 209 by the printing process shown, for example, in FIG. 2 and the resultant layers are subjected to the orientation treatment shown, for example, in FIG. 2. The divided waveplate material layer 3 is ink including a birefringent liquid crystal polymer having, for example, thermotoropic phase or lyotropic phase, or a photocurable monomer.

CONCRETE EXAMPLE 1

Figure 5:
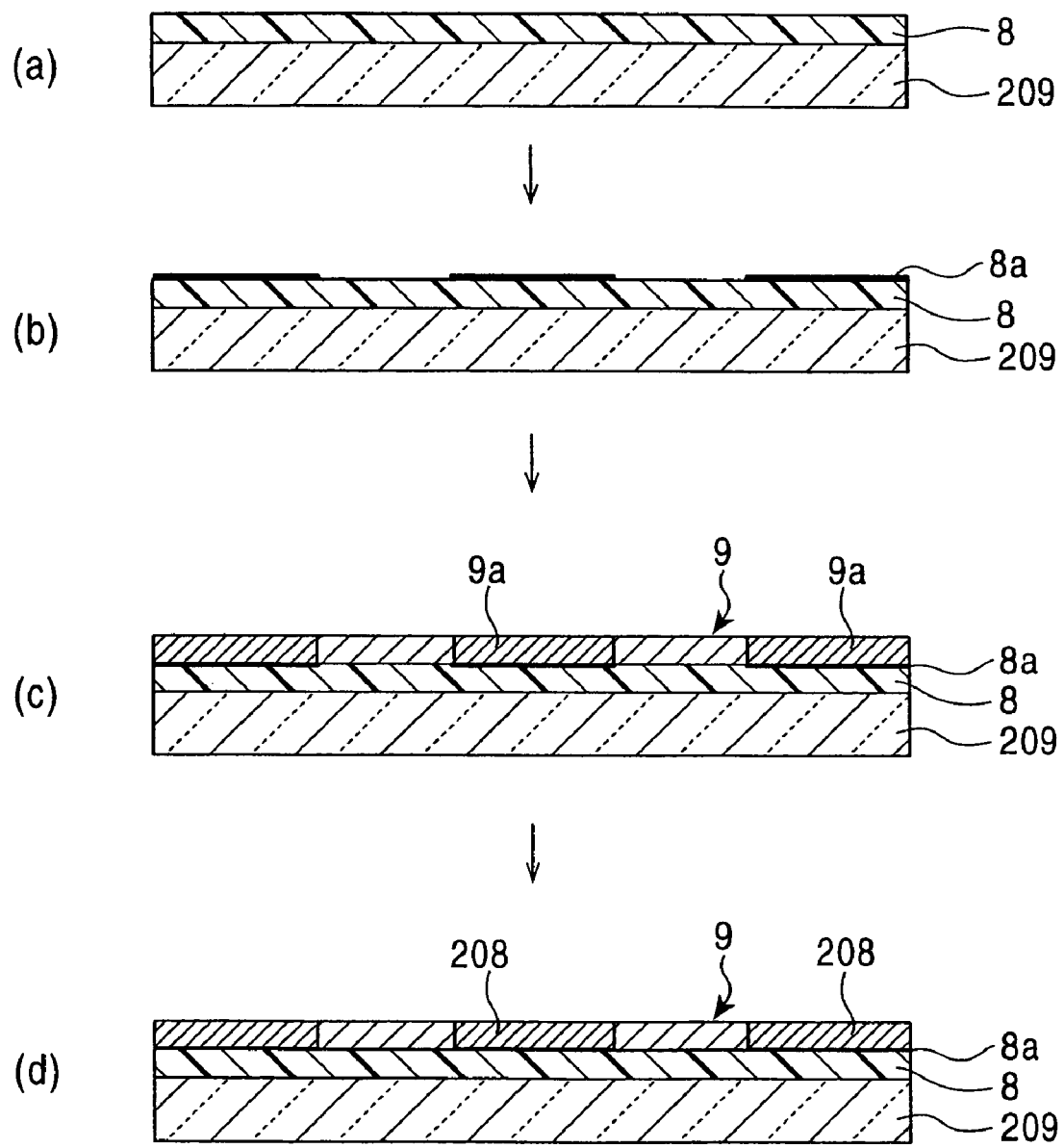
FIG. 5 illustrates Concrete Example of formation of the material layers and the orientation treatment according to each embodiment of the present invention.

FIG. 5 illustrates a concrete example of the formation of the material layers and the orientation treatment according to each embodiment of the present invention. An ink layer 9 includes a birefringent liquid crystal polymer having thermotoropic phase or a birefringent liquid crystal polymer having lyotropic phase. The divided waveplate is formed with the ink layer 9.

In a pre-treatment, referring to part (a) in FIG. 5, an alignment film 8 composed of, for example, polyimide is formed on the entire surface of the substrate 209. Referring to part (b) in FIG. 5, a rubbed portion 8a is formed by rubbing such that the alignment film 8 has a predetermined pattern.

Referring to part (c) in FIG. 5, the ink layer 9 is formed on the entire surface of the alignment film 8 by printing. In the case where the ink layer 9 includes a birefringent liquid crystal polymer having thermotoropic phase, the ink layer 9 is melted by heating and undergoes a phase change at the heating temperature. The ink is heated, melted, and printed on the alignment film 8. Accordingly, the ink layer 9 disposed on the rubbed portion 8a of the alignment film 8 undergoes a phase change along the orientation direction of the rubbed portion 8a.

In the case where the ink layer 9 includes a birefringent liquid crystal polymer having lyotropic phase, the ink layer 9 undergoes a phase change when dissolved in a solvent. The resulting ink, which is a solution of the birefringent liquid crystal polymer having lyotropic phase and the solvent, is printed on the alignment film 8. Accordingly, the ink layer 9 disposed on the rubbed portion 8a undergoes a phase change along the orientation direction of the rubbed portion 8a as the solvent evaporates.

Referring to portion (d) in FIG. 5, in post-treatment, the entire surface of the ink layer 9 including the birefringent liquid crystal polymer having thermotoropic phase is heated, thereby strengthening the orientation at the ink layer 9a disposed at the phase-change position. In the ink layer 9a including the birefringent liquid crystal polymer having lyotropic phase, the solvent is evaporated by heating, thereby forming the divided waveplates 208 having a strengthened orientation direction.

CONCRETE EXAMPLE 2

Figure 6:
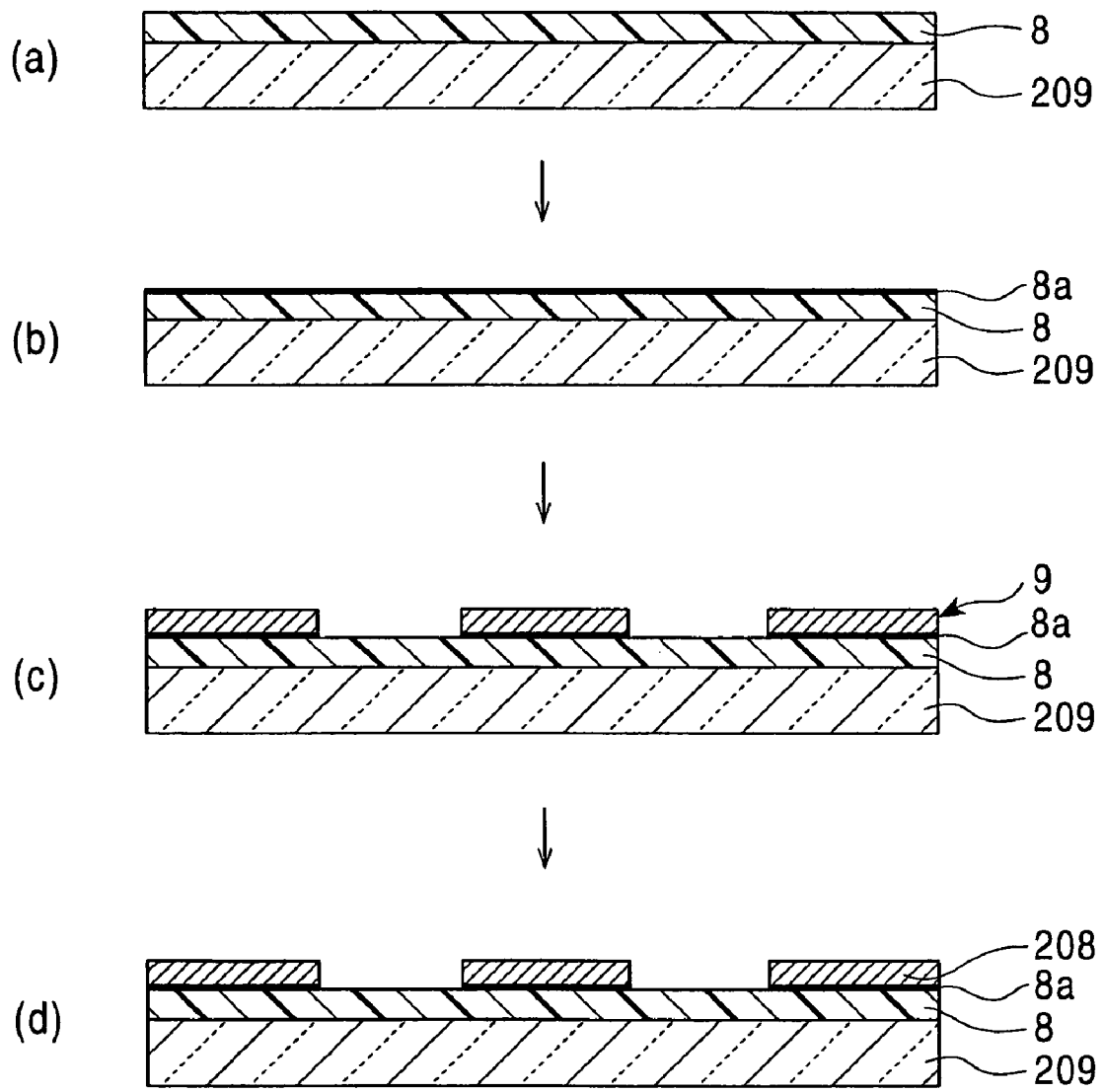
FIG. 6 illustrates Concrete Example of formation of the material layers and the orientation treatment according to each embodiment of the present invention.

FIG. 6 illustrates a concrete example of the formation of the material layers and the orientation treatment according to each embodiment of the present invention. An ink layer 9 includes a birefringent liquid crystal polymer having thermotoropic phase or a birefringent liquid crystal polymer having lyotropic phase. An example using a birefringent liquid crystal polymer having thermotoropic phase will be now described. The divided waveplate is formed with the ink layer 9.

In a pre-treatment, referring to part (a) in FIG. 6, an alignment film 8 composed of, for example, polyimide is formed on the entire surface of the substrate 209. Referring to part (b) in FIG. 6, a rubbed portion 8a is formed by rubbing, for example, on the entire surface of the alignment film 8.

Referring to part (c) in FIG. 6, the ink layer 9 is formed on the rubbed portion 8a by printing, such that the ink layer 9 has a predetermined pattern. As in Concrete Example 1, since the ink layer 9 includes a birefringent liquid crystal polymer having thermotoropic phase, the ink layer 9 is melted by heating and undergoes a phase change at the heating temperature. The ink is heated, melted, and printed on the alignment film 8. Accordingly, the ink layer 9 disposed on the alignment film 8, the entire surface of the alignment film 8 being subjected to orientation treatment, undergoes a phase change along the orientation direction of the rubbed portion 8a.

Referring to part (d) in FIG. 6, in post-treatment, as in Concrete Example 1, the ink layer 9 is heated, thereby strengthening the orientation at the ink layer 9. Accordingly, divided waveplates 208 having a strengthened orientation direction can be formed.

Figure 7:
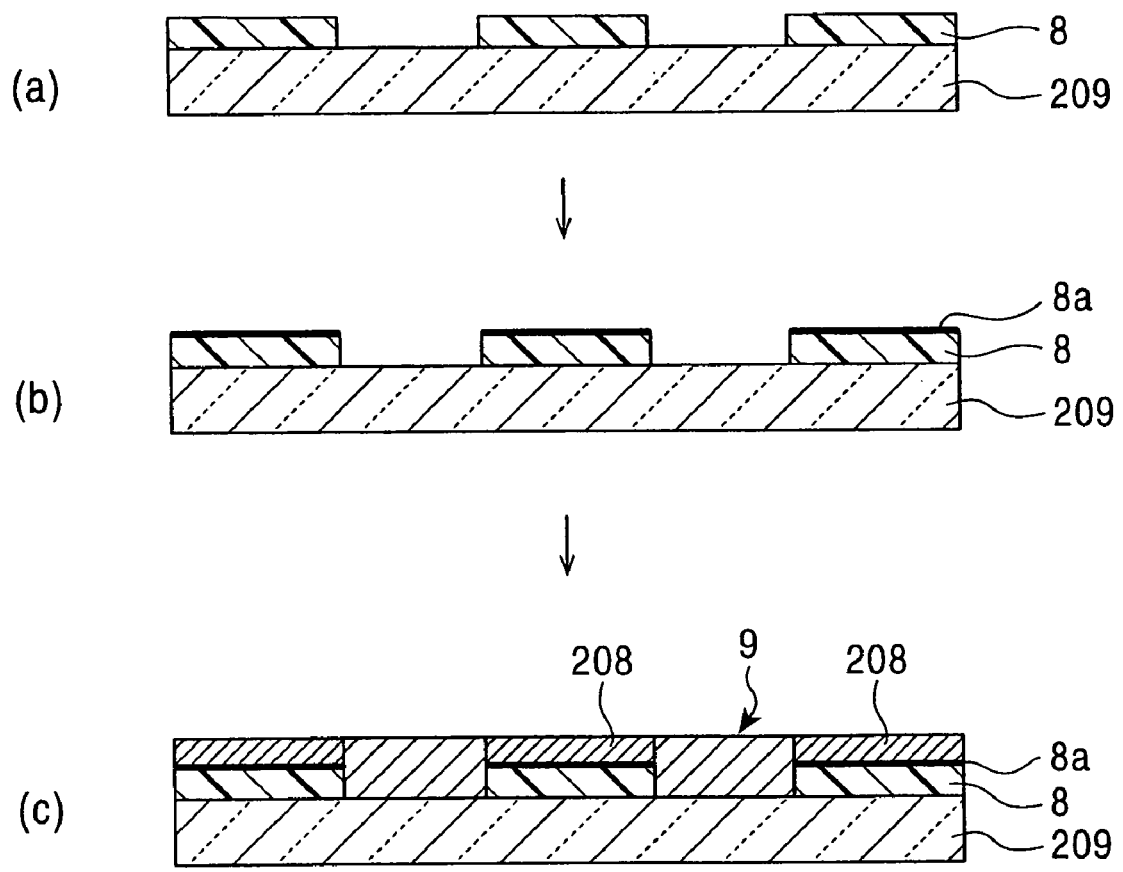
FIG. 7 illustrates a modification of an orientation treatment according to the present invention.
Figure 8:
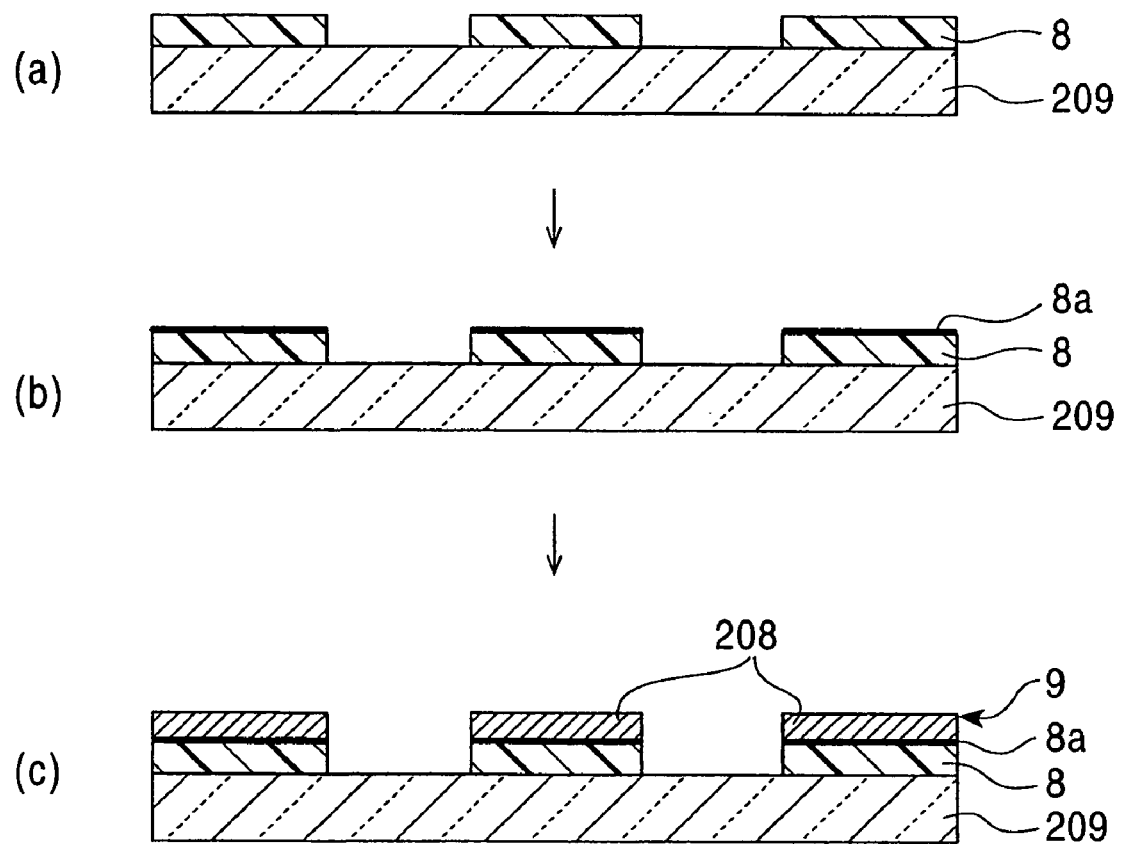
FIG. 8 illustrates a modification of an orientation treatment according to the present invention.

The methods using a birefringent liquid crystal polymer having thermotoropic phase or a birefringent liquid crystal polymer having lyotropic phase as the ink layer 9 are not limited to the examples described above, and various modifications are possible. FIGS. 7 and 8 show typical modifications.

Referring to part (a) in FIG. 7, the alignment film 8 composed of, for example, polyimide is formed on the substrate 209 by printing such that the alignment film 8 has a predetermined pattern. Referring to part (b) in FIG. 7, the upper surface of the alignment film 8 is rubbed, thereby forming the rubbed portion 8a.

Then, referring to part (c) in FIG. 7, the ink layer 9 is formed on the entire surface by printing. As in the above examples, the ink layer 9 disposed on the rubbed portion 8a undergoes a phase change along the orientation direction of the rubbed portion 8a, thereby forming the divided waveplates 208.

In the next modification, referring parts (a) and (b) in FIG. 8, the rubbed portion 8a of the alignment film 8 is formed as in parts (a) and (b) in FIG. 7.

Referring to part (c) in FIG. 8, the ink layer 9 is formed only on the alignment film 8 by printing, such that the ink layer 9 has the predetermined pattern. As in the above examples, the ink layer 9 disposed on the rubbed portion 8a undergoes a phase change along the orientation direction of the rubbed portion 8a, thereby forming the divided waveplates 208.

The orientation treatment of the birefringent liquid crystal polymer having thermotoropic phase or the birefringent liquid crystal polymer having lyotropic phase may be simultaneously performed during the printing (not shown in the figures).

CONCRETE EXAMPLE 3

Figure 9:
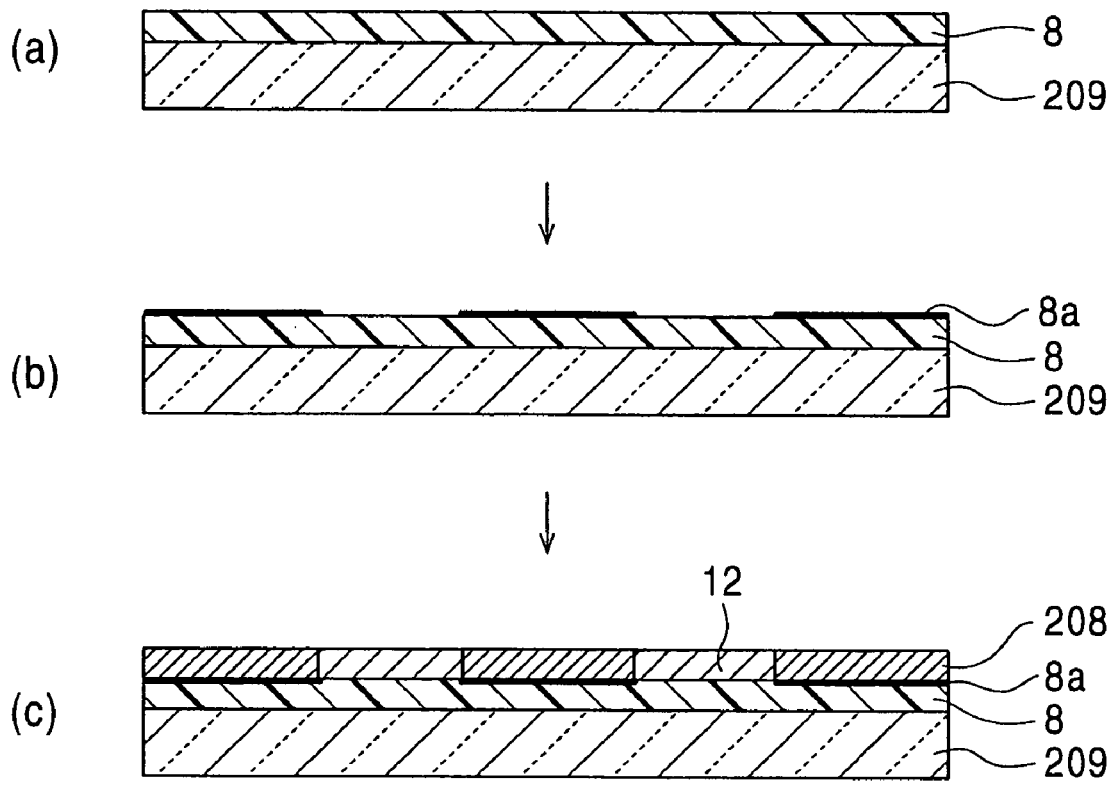
FIG. 9 illustrates Concrete Example of formation of the material layers and the orientation treatment according to each embodiment of the present invention.
Figure 10:
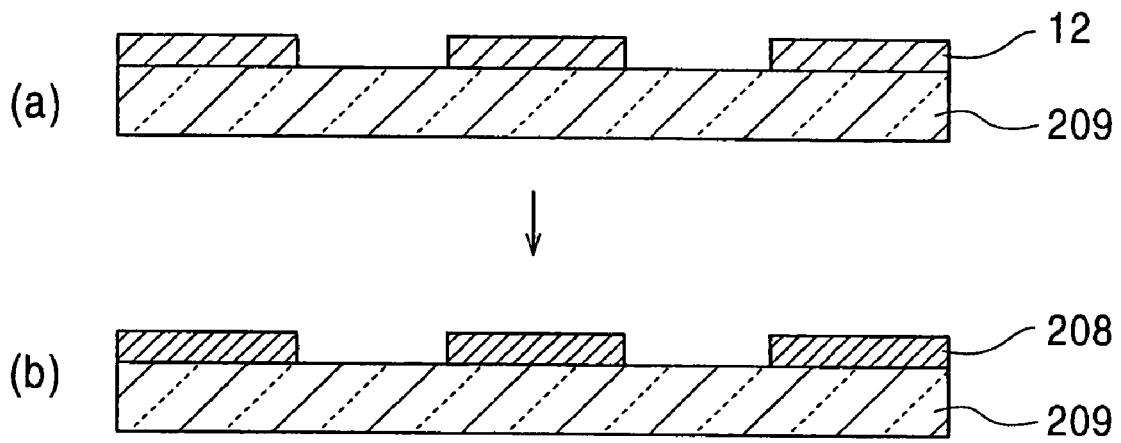
FIG. 10 illustrates Concrete Example of formation of the material layers and the orientation treatment according to each embodiment of the present invention.

FIGS. 9 and 10 illustrate concrete examples of the formation of divided waveplates using a photo-curable monomer as an ink layer 12. The monomer is eventually polymerized. The above examples basically include the following different methods: (1) a method using an alignment film as an underlayer; (2) another method wherein an alignment film is not formed and the monomer is exposed with polarized light; and (3) another method wherein the orientation treatment is performed after polymerization.

FIG. 9 illustrates the example described in (1) above. Referring to part (a) in FIG. 9, the alignment film 8 composed of, for example polyimide, is formed on the entire surface of the substrate 209. Referring to part (b) in FIG. 9, the alignment film 8 is rubbed to form the rubbed portion 8a such that the rubbed portion 8a has a predetermined pattern.

Referring to part (c) in FIG. 9, the ink layer 12 composed of a photo-curable monomer is formed on the entire surface by printing, and then the ink layer 12 is exposed. The ink layer 12 is polymerized and the ink layer 12 disposed on the rubbed portion 8a of the alignment film 8 undergoes a phase change along the orientation direction of the rubbed portion 8a. Thus, the divided waveplates 208 are formed.

FIG. 10 illustrates the example described in (2) above. Referring to part (a) in FIG. 10, the ink layer 12 composed of a photo-curable monomer is formed on the substrate 209 by printing such that the ink layer 12 has a predetermined pattern.

Referring to part (b) in FIG. 10, the entire surface of the substrate 209 is exposed with polarized light. Accordingly, the ink layer 12 having the predetermined pattern disposed on the substrate 209 undergoes a phase change, thereby forming the divided waveplates 208. Although not shown in the figure, the divided waveplates 208 may be formed as follows: The ink layer 12 is formed on the entire surface of the substrate 209 and is polymerized; and then the ink layer 12 is rubbed to form the predetermined pattern.

Figure 11:
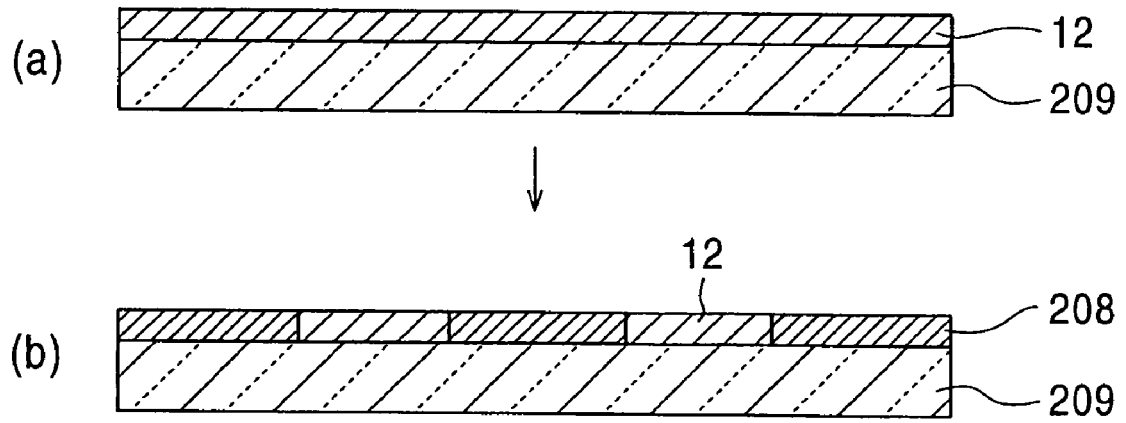
FIG. 11 illustrates Concrete Example of formation of the material layers and the orientation treatment according to each embodiment of the present invention.

FIG. 11 illustrates the example described in (3) above. Referring to part (a) in FIG. 11, the ink layer 12 is formed on the substrate 209. An alignment film is not formed on the substrate 209 in this example. Referring to part (b) in FIG. 11, the entire surface of the ink layer 12 is exposed to polymerize it. Then the ink layer 12 is rubbed locally such that the ink layer 12 has a predetermined pattern. Thus, the divided waveplates 208 are formed.

Figure 12:
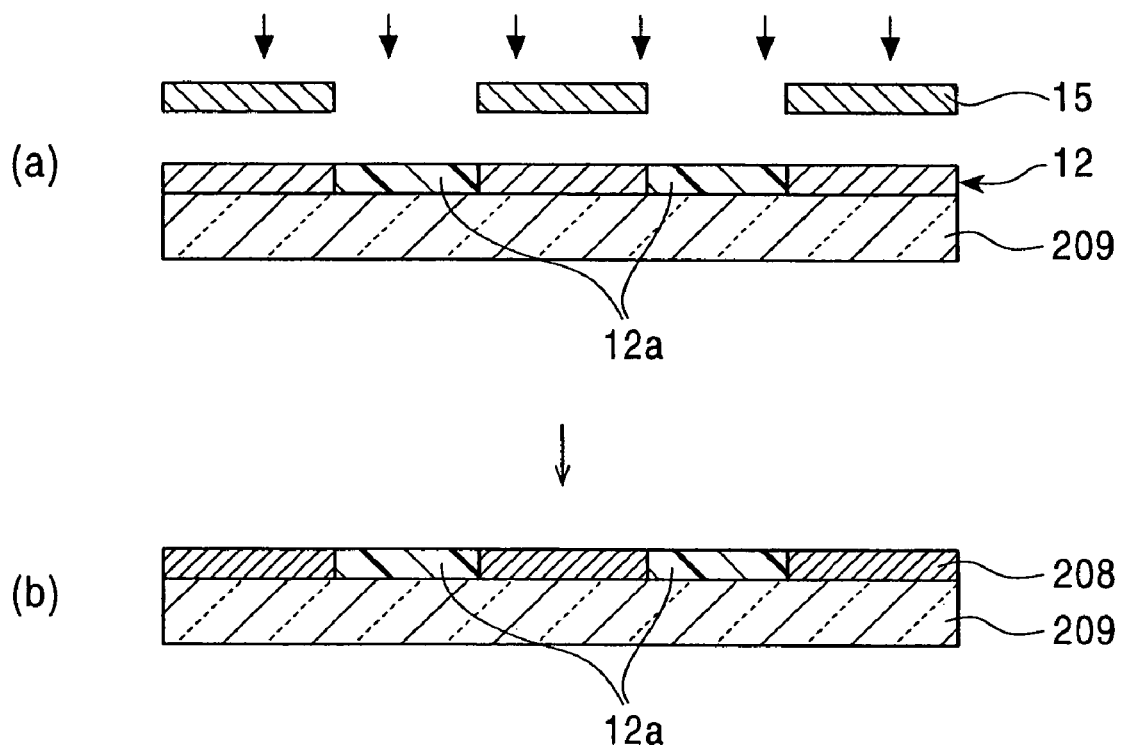
FIG. 12 illustrates a modification of an orientation treatment according to the present invention.

The methods using a photo-curable monomer as the ink layer 12 are not limited to the examples described above, and various modifications are possible. FIG. 12 shows a modification of the method using the photo-curable monomer including another orientation treatment.

Referring to part (a) in FIG. 12, the ink layer 12 is formed on the entire surface of the substrate 209, a mask for exposure 15 is disposed above the ink layer 12 to form a predetermined pattern, and then the entire surface is exposed with polarized light. The ink layer 12 disposed on unmasked areas is subjected to orientation treatment and is polymerized.

Referring to part (b) in FIG. 12, after removing the mask for exposure 15, the entire surface is further exposed. Thus, the ink layer 12 disposed on the area not exposed with polarized light due to the mask for exposure 15 is also polymerized. The divided waveplates 208 are formed in the area exposed with polarized light.

Third Embodiment

Figure 13:
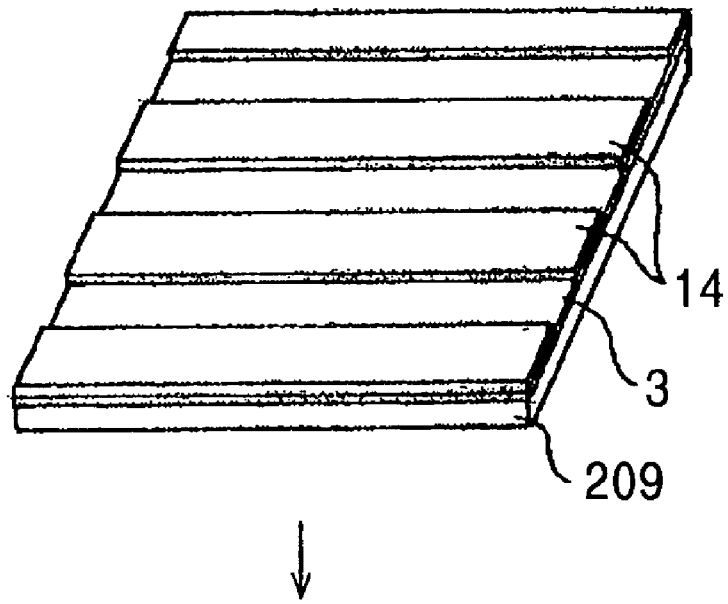
FIG. 13 illustrates an example of an orientation treatment according to a third embodiment of the present invention.
Figure 13:
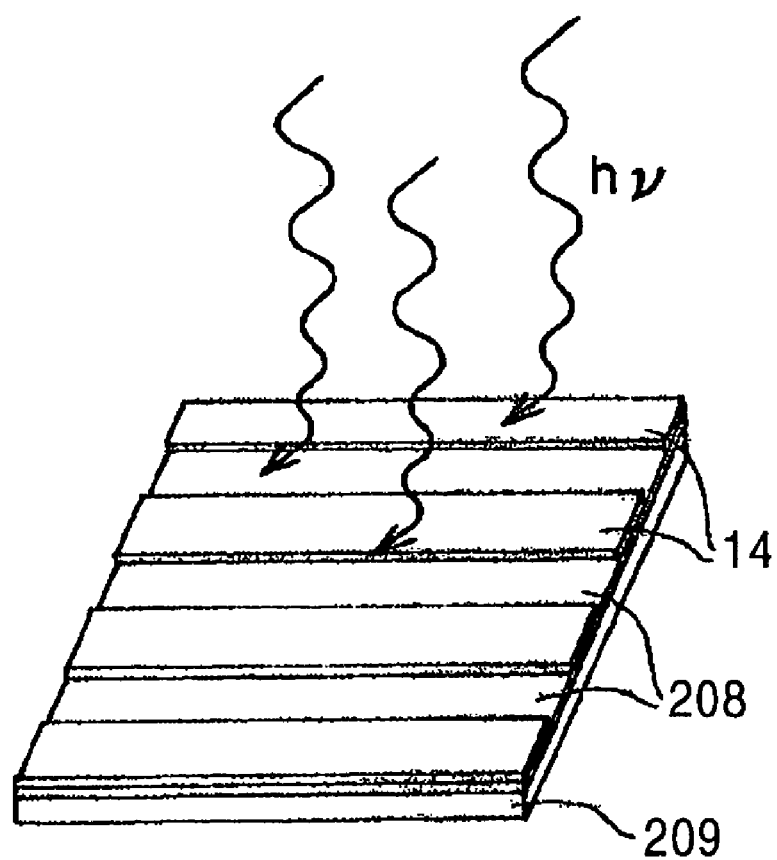

FIG. 13 illustrates an example wherein the orientation treatment described in the above embodiments is not performed.

Referring to part (a) in FIG. 13, a divided waveplate material layer 3 is formed on the entire surface of a substrate 209. Then a heat absorbing ink layer 14 is printed thereon with the printing process shown, for example, in FIG. 2 such that the heat absorbing ink layer 14 has a predetermined pattern. For example, a film having a phase-difference characteristic is used for the divided waveplate material layer 3 and the film is attached to the substrate 209.

Referring to part (b) in FIG. 13, the entire surface of the substrate 209 having the divided waveplate material layer 3 and the heat absorbing ink layer 14 is exposed. The phase-difference characteristic of the divided waveplate material layer 3 disposed under the heat absorbing ink layer 14 is removed because of the heat absorbed by the heat absorbing ink. Thus, the divided waveplates 208 are formed on the areas where the heat absorbing ink layer 14 is not disposed.

According to the third embodiment, the heat absorbing ink layer 14 is disposed on the divided waveplate material layer 3 such that the heat absorbing ink layer 14 has the predetermined pattern. Then the entire surface of the substrate 209 having the divided waveplate material layer 3 and the heat absorbing ink layer 14 is exposed, thereby removing the phase-difference characteristic of the divided waveplate material layer 3. As a result, the divided waveplates 208 are formed on the areas where the heat absorbing ink layer 14 is not disposed. Accordingly, the present embodiment provides a method for manufacturing a divided waveplate filter of a stereoscopic image display unit which meets the precision demands, namely, that the divided waveplates be formed with gaps therebetween so as to accurately correspond to the alternate lines of pixel, and the mass-production demands.

Fourth Embodiment

Figure 14A:
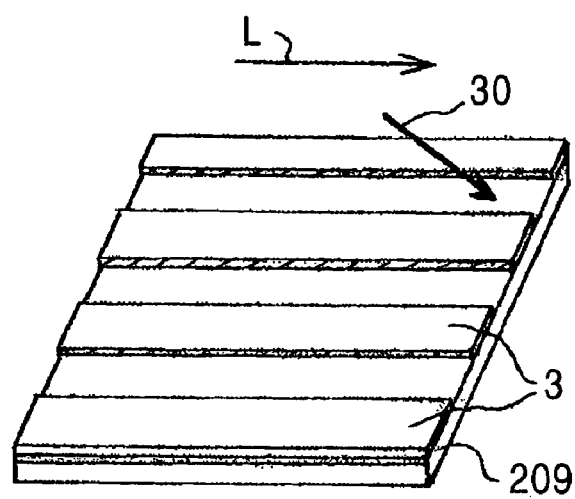
FIG. 14A is a schematic perspective view showing a method for forming a divided waveplate filter by laser irradiation.
Figure 14B:
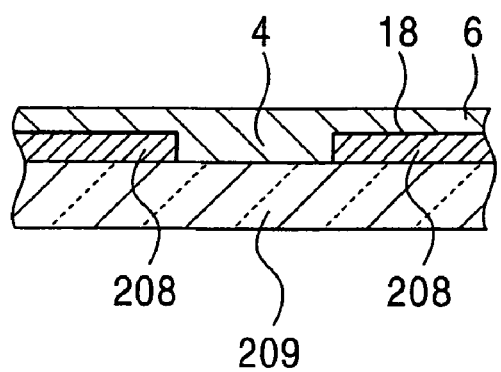
FIG. 14B is an enlarged sectional view of the relevant part after irradiation according to the method for forming a divided waveplate filter by laser irradiation.
Figure 14C:
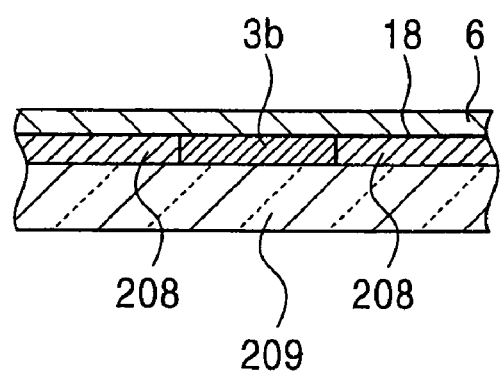
FIG. 14C is an enlarged sectional view of the relevant part showing the state after removing the phase-difference characteristic by laser heating according to the method for forming a divided waveplate filter by laser irradiation.

FIGS. 14A, 14B, and 14C are schematic views showing a method for forming a divided waveplate filter by laser irradiation. A divided waveplate material layer 3 having a division pattern is formed by laser irradiation according to a predetermined pattern. FIG. 14A is a schematic perspective view, FIG. 14B is an enlarged sectional view of the relevant part after irradiation, and FIG. 14C is an enlarged sectional view of the relevant part showing the state after removing the phase-difference characteristic by laser heating.

Referring to FIG. 14A, the divided waveplate material layer 3 is formed on the entire surface of the substrate 209. A laser oscillator (not shown in the figure) programmed to form the predetermined pattern scans light in the line direction L so that the divided waveplates are formed. The divided waveplate material layer 3 is selectively removed by ablation due to the laser irradiation 30, thereby forming the divided waveplates having the predetermined pattern corresponding to the design with high precision. Accordingly, the divided waveplates are formed with gaps therebetween so as to accurately correspond to the alternate lines of pixel of the pixellated liquid crystal part 205 shown in FIG. 19, and the mass productivity can be enhanced.

The divided waveplate material layer 3 is, for example, a film having a phase-difference characteristic, in particular, laser absorbing material. For example, titanium oxide 18, which absorbs laser light, may be disposed on the entire surface of the divided waveplate material layer 3 (see FIG. 14C). In that case, the wavelength of the laser light to be irradiated is preferably selected such that the laser light is easily transmitted to the titanium oxide 18.

Referring to FIG. 14B, the divided waveplate material layer 3 in the area where the laser is scanned is removed by ablation due to the laser irradiation 30 to form the removed portion 4. The divided waveplate material layer 3 disposed in the remaining area is efficiently formed into the divided waveplates 208 having the predetermined pattern. Finally, the entire surface is covered with a protective layer 6 to flatten the surface of the removed portion 4.

The heat caused by the laser irradiation 30 may be decreased by controlling the voltage in the laser oscillator. Referring to FIG. 14C, if laser light which causes a small amount of heat is irradiated, the phase-difference characteristic of the divided waveplate material layer 3 is removed. The irradiated area may be left as a characteristic-removed portion 3b, and the characteristic-removed portion 3b may be disposed between the divided waveplates 208. Finally, the entire surface may be covered with the protective layer 6.

According to the fourth embodiment, the laser-absorbing divided waveplate material layer 3 is disposed on the entire surface of the substrate 209, and the substrate 209 is selectively irradiated with laser light. Then the divided waveplate material layer 3 is removed to have the predetermined pattern, thereby forming the divided waveplates 208. According to the present embodiment, the divided waveplates 208 can be precisely formed and can be mass-produced. Furthermore, the present embodiment provides a method for manufacturing a divided waveplate filter of a stereoscopic image display unit which meets the precision demands, namely, that the divided waveplates be formed with gaps therebetween so as to accurately correspond to the alternate lines of pixel, and the mass-production demands.

Fifth Embodiment

Figure 15:
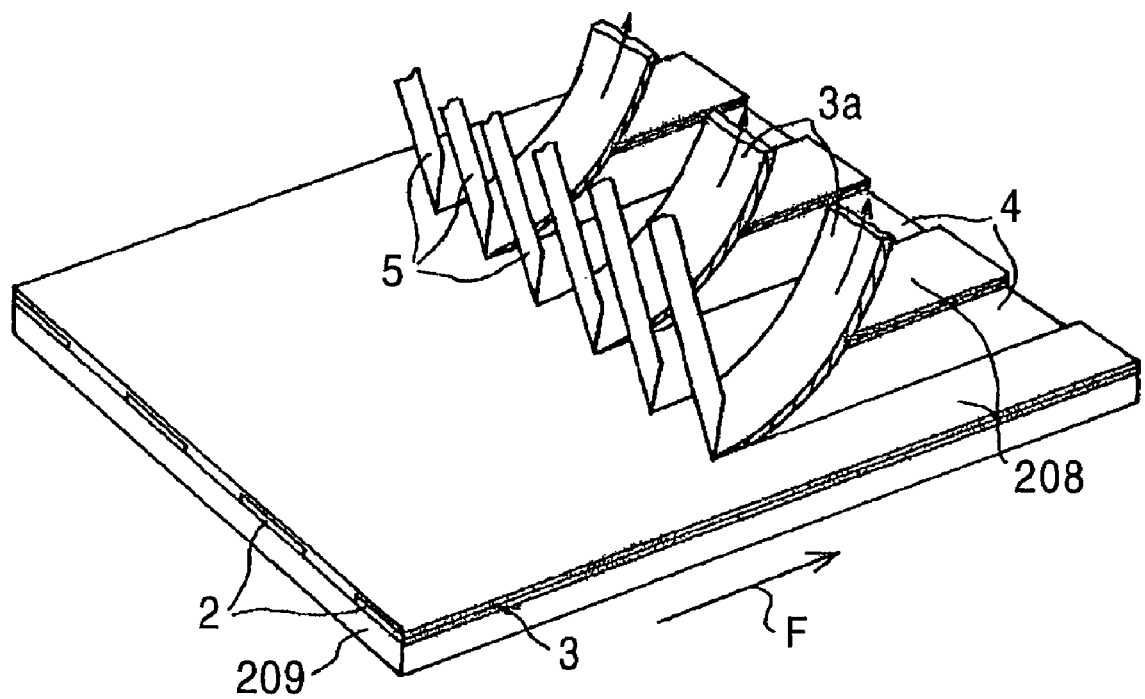
FIG. 15 is a schematic perspective view of an example showing a cutting state of a divided waveplate material layer according to a fifth embodiment of the present invention.
Figure 16:
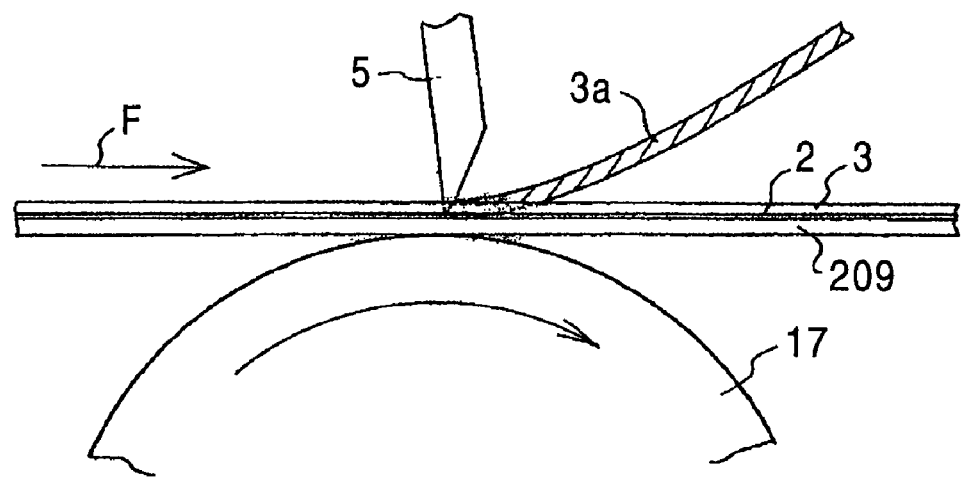
FIG. 16 is a schematic view of an example showing a cutting state of a divided waveplate material layer according to the present invention.
Figure 17:
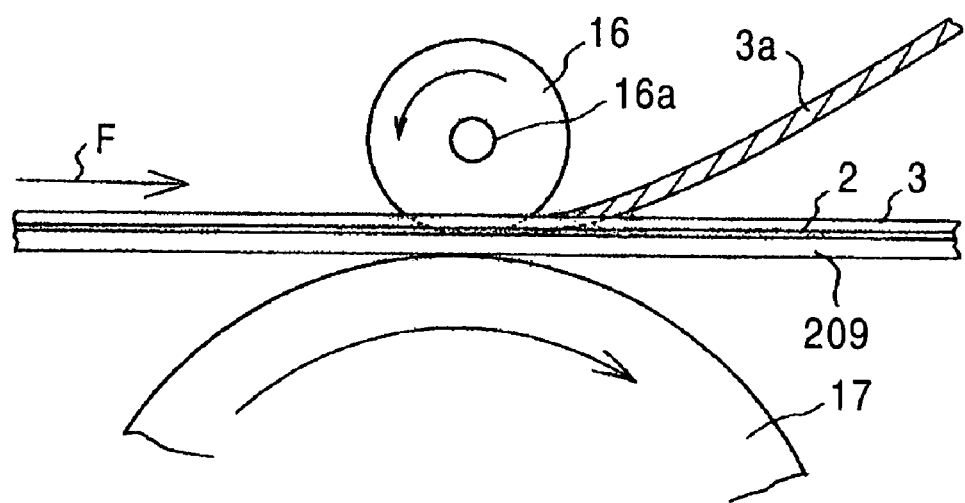
FIG. 17 is a schematic view of an example showing a cutting state of a divided waveplate material layer according to the present invention.

The present embodiment includes a method for dividing a divided waveplate material layer 3 disposed on a substrate 209 by cutting such that the divided waveplate material layer 3 has a predetermined pattern. FIGS. 15, 16, and 17 are schematic views showing concrete examples of a cutting state of the divided waveplate material layer.

FIG. 15 shows a concrete example of division, for example, according to the first embodiment of the present invention. Referring to FIG. 15, for example, an adhesive 2 is formed on a substrate 209 such that the adhesive 2 has a predetermined division pattern, as designed. A divided waveplate material layer 3 is formed on the entire surface of the substrate 209 having the adhesive 2. Cutter blades 5 are fixed in position in a row on the divided waveplate material layer 3 such that the cutter blades 5 are disposed parallel to both sides of the adhesive 2. The substrate 209 is carried in the direction indicated by an arrow F, thereby cutting the divided waveplate material layer 3, peeling peeled portions 3a to be removed, and taking up the peeled portions 3a on take-up equipment (not shown in the figure).

As results of cutting and removing the peeled portions 3a, removed portions 4 are formed in the areas where the peeled portions 3a are peeled, divided waveplates 208 are formed in the areas where the divided waveplate material layer 3 is not removed. Accordingly, the divided waveplates are formed with gaps therebetween so as to accurately correspond to the alternate lines of pixel of the pixellated liquid crystal part 205 shown in FIG. 19. The divided waveplates 208 can be precisely formed on the substrate 209 such that the divided waveplates 208 have the predetermined pattern. Furthermore, the divided waveplates 208 can be mass-produced.

FIG. 16 shows a method for carrying the substrate 209 in the direction indicated by the arrow F. Referring to FIG. 16, for example, feed roller 17 may be used. Furthermore, for example, the substrate 209 may be disposed on a planar or substantially planar support table and may be carried by a carrying method (not shown in the figure) in the direction indicated by the arrow F. The cutter blades 5 may be moved in the direction opposite to that indicated by the arrow F while fixing the substrate 209.

FIG. 17 shows another example of the cutting method. According to this example, rotary cutters 16 are disposed in a row, as with the cutter blades 5 shown in FIG. 15, and a shaft 16*a* of the rotary cutters 16 is fixed in position. Peeled portions 3*a* peeled after cutting are taken up on take-up equipment, as shown in FIG. 15. The carrying method may be the same method described in the above example. The rotary cutters 16 may be moved while fixing the substrate 209.

Figure 18:
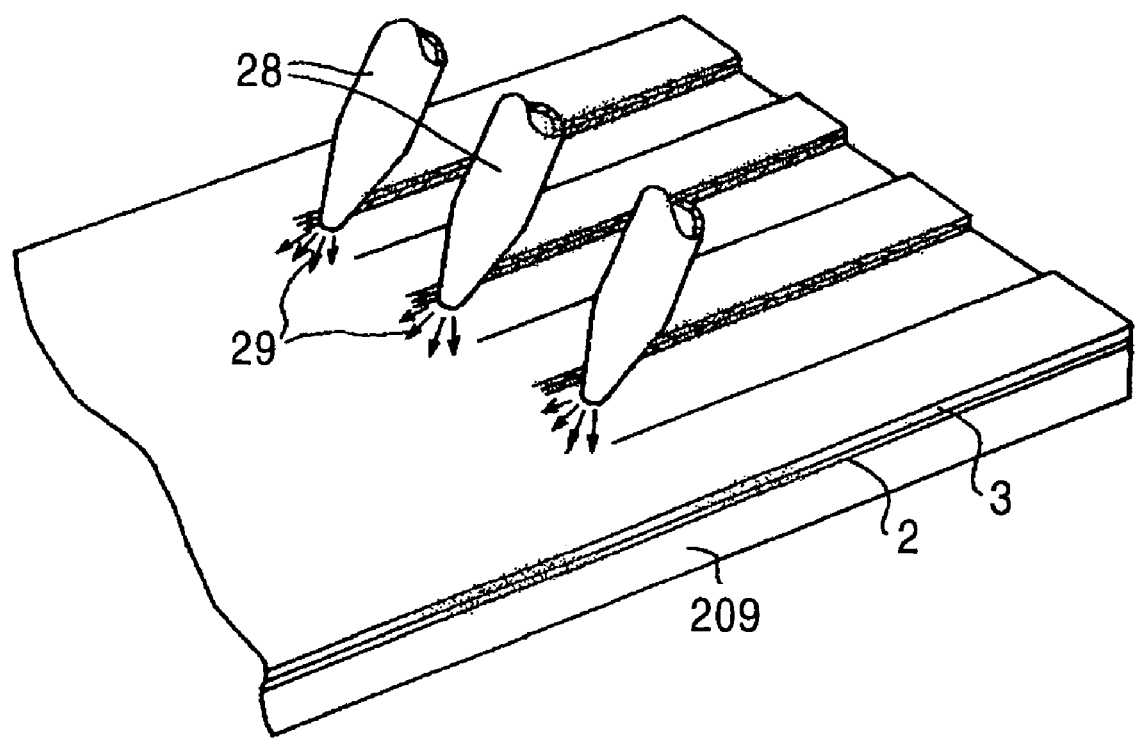
FIG. 18 is a schematic perspective view of a modification showing a cutting state of a divided waveplate material layer according to the present invention.

FIG. 18 is a schematic perspective view showing a modification of the cutting and removing process described above. Referring to FIG. 18, nozzles 28 jetting a liquid, such as water, with high-pressure may be disposed in a row having a predetermined pattern. The divided waveplate material layer 3 disposed on the substrate 209 may be selectively removed by the jet pressure.

According to this example, an adhesive 2 is disposed on the substrate 209 such that the adhesive 2 has a predetermined pattern, and then the divided waveplate material layer 3 may be disposed thereon. Furthermore, the divided waveplate material layer 3 may be a birefringent liquid crystal polymer, or a polymer prepared by polymerizing a photo-curable monomer.

The liquid 29 jetted with high pressure may be, for example, water. The temperature of the water is not limited. Hot water enhances the selective removal ability of the divided waveplate material layer 3. Accordingly, hot water is preferably used for removing a large area, for example, in the case where the divided waveplate material layer 3 has a large thickness (for example 30 μm, see FIG. 1) and has a large removal area (for example 100 μm).

According to the fifth embodiment, the adhesive 2 is formed on a substrate 209 such that the adhesive 2 has a predetermined division pattern, and then the divided waveplate material layer 3 is formed on the entire surface of the substrate 209 having the adhesive 2. The divided waveplate material layer 3 is cut all at once parallel to both sides of the adhesive 2 with the cutter blades 5 or the rotary cutters 16 disposed in a row. Therefore, the divided waveplates having the predetermined pattern corresponding to the design can be precisely formed and can be mass-produced. Furthermore, the present embodiment provides a method for manufacturing a divided waveplate filter of a stereoscopic image display unit which meets the precision demands, namely, that the divided waveplates be formed with gaps therebetween so as to accurately correspond to the alternate lines of pixel, and the mass-production demands.

Each of the embodiments described above can be modified according to the technical idea of the present invention.

For example, the processes for forming the divided waveplates 208 according to the embodiments may be any suitable processes other than those described in the embodiments above. The materials and the orientation treatment may be changed, as long as they have the same function.

Furthermore, the method for forming the divided waveplates 208 by transcribing may be another method other than the method described in the embodiments above. The method for cutting and removing may be any suitable method other than the method described in the embodiments above.

Furthermore, the present invention can be applied not only to the observation of stereoscopic images using polarization eyeglasses but also to the conventional observation of stereoscopic images using, for example, parallax caused by polarization.

What is claimed is:

1. A method for manufacturing a divided waveplate filter including divided waveplates for controlling a polarization direction of light emitted from a pixel region divided corresponding to parallax in a pixellated display unit, the method comprising the steps of:

forming a material layer having a phase-difference characteristic for the divided waveplates on a first area of a substrate;

forming a heat-absorbing layer on the material layer with a periodic pattern for the divided waveplates; and exposing the entire first area of the substrate with light such that the phase-difference characteristic is removed from a portion of the material layer covered by the heat-absorbing layer to form the divided waveplates.

2. The method for manufacturing a divided waveplate filter according to claim 1, wherein the heat-absorbing layer formed on the material layer is titanium oxide.

3. The method for manufacturing a divided waveplate filter according to claim 1, wherein the divided waveplates are covered with a protective layer.

4. The method for manufacturing a divided waveplate filter according to claim 1, wherein the heat-absorbing layer formed on the material layer is a heat-absorbing ink layer.

5. A method for manufacturing a divided waveplate filter including divided waveplates for controlling a polarization direction of light emitted from a pixel region divided corresponding to parallax in a pixellated display unit, the method comprising the steps of:

forming a material layer having a phase-difference characteristic for the divided waveplates;

forming a laser-absorbing material layer on the material layer;

irradiating the material layer with laser light such that the phase-difference characteristic of the material layer is selectively removed according to the periodic pattern for the divided waveplates; and leaving a characteristic-removed portion disposed between the divided waveplates, the characteristic-removed portion being a portion of the material layer where the phase-difference characteristic was selectively removed by the irradiating step.

6. The method for manufacturing a divided waveplate filter according to claim 5, wherein the laser-absorbing material layer formed on the material layer is titanium oxide.

7. The method for manufacturing a divided waveplate filter according to claim 5, wherein the divided waveplates formed by laser irradiation are covered with a protective layer.

8. The method for manufacturing a divided waveplate filter according to claim 5, wherein the material layer is a birefringent liquid crystal polymer layer having thermotropic phase.

9. The method for manufacturing a divided waveplate filter according to claim 5, wherein the material layer is a birefringent liquid crystal polymer layer having lyotropic phase.

10. The method for manufacturing a divided waveplate filter according to claim 5, wherein the material layer is a photo-curable monomer.

11. The method for manufacturing a divided waveplate filter according to claim 6, wherein the irradiated laser light is of a wavelength in an absorption band of the titanium oxide.

12. The method for manufacturing a divided waveplate filter according to claim 5, wherein the divided waveplates have a uniform width in the range of 100 to 200 micrometers.

13. The method for manufacturing a divided waveplate filter according to claim 5, wherein the phase-difference characteristic of each of the divided waveplates provides a change in polarization of 90 degrees for a light passing through said waveplate.

14. A method for manufacturing a divided waveplate filter including divided waveplates for controlling a polarization direction of light emitted from a pixel region divided corresponding to parallax in a pixellated display unit, the method comprising the steps of:

forming a material layer having a phase-difference characteristic for the divided waveplates;

forming a laser-absorbing material layer on the material layer;

irradiating the material layer with laser light such that the phase-difference characteristic of the material layer is selectively removed according to the periodic pattern for the divided waveplates;

leaving a characteristic-removed portion disposed between the divided waveplates, the characteristic-removed portion being a portion of the material layer where the phase-difference characteristic was selectively removed by the irradiating step; and covering the divided waveplates and the characteristic-removed portion disposed between the divided waveplates with a protective layer.

* * * * *